United States Patent
Burgener et al.

(10) Patent No.: US 7,123,898 B2
(45) Date of Patent: Oct. 17, 2006

(54) SWITCH CIRCUIT AND METHOD OF SWITCHING RADIO FREQUENCY SIGNALS

(75) Inventors: Mark L. Burgener, San Diego, CA (US); James S. Cable, Del Mar, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 10/922,135

(22) Filed: Aug. 18, 2004

(65) Prior Publication Data

US 2005/0017789 A1 Jan. 27, 2005

Related U.S. Application Data

(63) Continuation of application No. 10/267,531, filed on Oct. 8, 2002, now Pat. No. 6,804,502.

(60) Provisional application No. 60/328,353, filed on Oct. 10, 2001.

(51) Int. Cl.
 H04B 1/28 (2006.01)
 H01L 29/76 (2006.01)
 H04Q 7/20 (2006.01)
 H04M 1/00 (2006.01)

(52) U.S. Cl. .................. 455/333; 455/425; 455/550.1; 257/341

(58) Field of Classification Search ............... 455/26.1, 455/78, 333, 425, 550.1, 556.1, 560; 257/280, 257/281, 341, 472
 See application file for complete search history.

(56) References Cited

U.S. PATENT DOCUMENTS 3,699,359 A 10/1972 Shelby
5,012,123 A 4/1991 Ayasli et al.
5,313,083 A 5/1994 Schindler (Continued)

FOREIGN PATENT DOCUMENTS

JP A-06-334506 12/1994

(Continued)

OTHER PUBLICATIONS

Huang, "A 0.5 •m CMOS T/R Switch for 900-MHz Wireless Applications"; IEEE Journal of Solid-State Circuits, vol. 36, No. 3, Mar. 2001, pp. 486-492.

(Continued)

*Primary Examiner*—Binh K. Tieu
(74) *Attorney, Agent, or Firm*—Jaquez & Associates; Martin J. Jaquez, Esq.

(57) ABSTRACT

A novel RF buffer circuit adapted for use with an RF switch circuit and method for switching RF signals is described. The RF switch circuit is fabricated in a silicon-on-insulator (SOI) technology. The RF switch includes pairs of switching and shunting transistor groupings used to alternatively couple RF input signals to a common RF node. The switching and shunting transistor grouping pairs are controlled by a switching control voltage (SW) and its inverse (SW_). The switching and shunting transistor groupings comprise one or more MOSFET transistors connected together in a "stacked" or serial configuration. The stacking of transistor grouping devices, and associated gate resistors, increase the breakdown voltage across the series connected switch transistors and operate to improve RF switch compression. A fully integrated RF switch is described including digital control logic and a negative voltage generator integrated together with the RF switch elements. In one embodiment, the fully integrated RF switch includes a built-in oscillator, a charge pump circuit, CMOS logic circuitry, level-shifting and voltage divider circuits, and an RF buffer circuit. Several embodiments of the charge pump, level shifting, voltage divider, and RF buffer circuits are described. The inventive RF switch provides improvements in insertion loss, switch isolation, and switch compression.

20 Claims, 13 Drawing Sheets

U.S. PATENT DOCUMENTS

| | | | |
|---|---|---|---|
| 5,416,043 | A | 5/1995 | Burgener et al. |
| 5,492,857 | A | 2/1996 | Reedy et al. |
| 5,548,239 | A | 8/1996 | Kohama |
| 5,553,295 | A | 9/1996 | Pantelakis et al. |
| 5,572,040 | A | 11/1996 | Reedy et al. |
| 5,596,205 | A | 1/1997 | Reedy et al. |
| 5,600,169 | A | 2/1997 | Burgener et al. |
| 5,663,570 | A | 9/1997 | Reedy et al. |
| 5,777,530 | A | 7/1998 | Nakatuka |
| 5,801,577 | A | 9/1998 | Tailliet |
| 5,861,336 | A | 1/1999 | Reedy et al. |
| 5,863,823 | A | 1/1999 | Burgener |
| 5,883,396 | A | 3/1999 | Reedy et al. |
| 5,895,957 | A | 4/1999 | Reedy et al. |
| 5,920,233 | A | 7/1999 | Denny |
| 5,930,638 | A | 7/1999 | Reedy et al. |
| 5,945,867 | A | 8/1999 | Uda et al. |
| 5,973,363 | A | 10/1999 | Staab et al. |
| 5,973,382 | A | 10/1999 | Burgener et al. |
| 6,057,555 | A | 5/2000 | Reedy et al. |
| 6,066,993 | A | 5/2000 | Yamamoto et al. |
| 6,642,578 | B1 | 11/2003 | Arnold et al. |

FOREIGN PATENT DOCUMENTS

| | | |
|---|---|---|
| JP | A-08-307305 | 11/1996 |
| JP | A-10-242829 | 9/1998 |

OTHER PUBLICATIONS

Lauterbach, et al., "Charge Sharing Concept and New Clocking Scheme for Power Efficiency and Electromagnetic Emission Improvement of Boosted Charge Pumps", IEEE Journal of Sol.

Makioka, et al., "Super Self-Aligned GaAs RF Switch IC with 0.25 dB Extremely Low Insertion Loss for Mobile Communication Systems", IEEE Transactions on Electron Devices, vol.

Rodgers, et al., "Silicon UTSi CMOS RFIC for CDMA Wireless Communications Systems", Peregrine Semiconductor Corporation, 1999 IEEE MTT-S Digest.

Megahed, et al, "Low Cost UTSI Technology for RF Wireless Applications", Peregrine Semiconductor Corporation, 1998 IEEE MTT-S Digest.

Johnson, et al., "Advanced Thin-Film Silicon-on-Sapphire Technology: Microwave Circtuit Applications", IEEE Transactions on Electron Devices, vol. 45, No. 5, May 1998, pp. 1047-1054.

Mark L. Burgener, "CMOS SOS Switches Offer Useful Features, High Integration", CMOS SOS Switches, Microwaves & RF, Aug. 2001, pp. 107-118.

SWITCH CIRCUIT AND METHOD OF SWITCHING RADIO FREQUENCY SIGNALS

CROSS-REFERENCE TO RELATED UTILITY AND PROVISIONAL APPLICATIONS—CLAIM OF PRIORITY UNDER 35 USC SECTIONS 120 AND 119(e)

This is a continuation application of application Ser. No. 10/267,531, filed Oct. 8, 2002, now U.S. Pat. No. 6,805,502, which claims the benefit of U.S. Provisional Application No. 60/328,353, filed Oct. 10, 2001. Both the parent application (U.S. application Ser. No. 10/267,531, filed Oct. 8, 2002) and the related provisional application (U.S. Provisional Application No. 60/328,353 , filed Oct. 10, 2001 ) are incorporated by reference herein in their entirety.

BACKGROUND OF THE INVENTION

1. Field of the Invention

The present invention relates to switches, and particularly to a switch circuit and method of switching radio frequency (RF) signals within an integrated circuit. In one embodiment, the switch circuit comprises CMOS devices implemented on a silicon-on-insulator (SOI) substrate, for use in RF applications such as wireless communications, satellites, and cable television.

2. Description of Related Art

As is well known, radio frequency (RF) switches are important building blocks in many wireless communication systems. RF switches are found in many different communications devices such as cellular telephones, wireless pagers, wireless infrastructure equipment, satellite communications equipment, and cable television equipment. As is well known, the performance of RF switches is controlled by three primary operating performance parameters: insertion loss, switch isolation, and the "1 dB compression point." These three performance parameters are tightly coupled, and any one parameter can be emphasized in the design of RF switch components at the expense of others. A fourth performance parameter that is occasionally considered in the design of RF switches is commonly referred to as the switching time or switching speed (defined as the time required to turn one side of a switch on and turn the other side off). Other characteristics that are important in RF switch design include ease and degree (or level) of integration of the RF switch, complexity, yield, return loss and cost of manufacture.

These RF switch performance parameters can be more readily described with reference to a prior art RF switch design shown in the simplified circuit schematics of FIGS. 1a–1c. FIG. 1a shows a simplified circuit diagram of a prior art single pole, single throw (SPST) RF switch 10. The prior art SPST switch 10 includes a switching transistor M1 5 and a shunting transistor M2 7. Referring now to FIG. 1a, depending upon the state of the control voltages of the two MOSFET transistors M1 5 and M2 7 (i.e., depending upon the DC bias applied to the gate inputs of the MOSFET switching and shunting transistors, M1 and M2, respectively), RF signals are either routed from an RF input node 1 to an RF output node 3, or shunted to ground through the shunting transistor M2 7. Actual values of the DC bias voltages depend upon the polarity and thresholds of the MOSFET transistors M1 5 and M2 7. Resistor R0 9, in series with the RF source signal, isolates the bias from the source signal and is essential for optimal switch performance. FIG. 1b shows the "on" state of the RF switch 10 of FIG. 1a (i.e., FIG. 1b shows the equivalent small-signal values of the transistors M1 and M2 when the RF switch 10 is "on", with switching transistor M1 5 on, and shunting transistor M2 7 off). FIG. 1c shows the "off" state of the switch 10 of FIG. 1a (i.e., FIG. 1c shows the equivalent small-signal values of the transistors M1 and M2 when the RF switch 10 is "off", with switching transistor M1 5 off, and shunting transistor M2 7 on).

As shown in FIG. 1b, when the RF switch 10 is on, the switching transistor M1 5 is primarily resistive while the shunting transistor M2 7 is primarily capacitive. The "insertion loss" of the RF switch 10 is determined from the difference between the maximum available power at the input node 1 and the power that is delivered to a load 11 at the output node 3. At low frequencies, any power lost is due to the finite on resistance "r" 13 of the switching transistor M1 5 when the switch 10 is on (see FIG. 1b). The on resistance r 13 (FIG. 1b) typically is much less than the source resistor R0 9. The insertion loss, "IL", can therefore be characterized in accordance with Equation 1 shown below:

$$IL \text{ is approximately equal to: } 10r/R0 \ln(10) = 0.087r \text{ (in dB).} \quad \text{Equation 1}$$

Thus, at low frequencies, a 3-Ω value for r results in approximately 0.25 dB insertion loss. Because insertion loss depends greatly upon the on resistances of the RF switch transmitters, lowering the transistor on resistances and reducing the parasitic substrate resistances can achieve improvements in insertion loss.

In general, the input-to-output isolation (or more simply, the switch isolation) of an RF switch is determined by measuring the amount of power that "bleeds" from the input port into the output port when the transistor connecting the two ports is off. The isolation characteristic measures how well the RF switch turns off (i.e., how well the switch blocks the input signal from the output). More specifically, and referring now to the "off" state of the RF switch 10 of FIG. 1c, the switching transistor M1 5 off state acts to block the input 1 from the output 3. The shunting transistor M2 7 also serves to increase the input-to-output isolation of the switch 10.

When turned off (i.e., when the RF switch 10 and the switching transistor M1 5 are turned off), M1 5 is primarily capacitive with "feedthrough" (i.e., passing of the RF input signal from the input node 1 to the output node 3) of the input signal determined by the series/parallel values of the capacitors CGD off 15 (Gate-to-Drain Capacitance when the switching transistor M1 is turned off), CGS off 17 (Gate-to-Source Capacitance when the switching transistor M1 is turned off), and CDS1 19 (Drain-to-Source capacitance when the transistor M1 is turned off). Feedthrough of the input signal is undesirable and is directly related to the input-to-output isolation of the RF switch 10. The shunting transistor M2 7 is used to reduce the magnitude of the feedthrough and thereby increase the isolation characteristic of the RF switch.

The shunting transistor M2 7 of FIG. 1c is turned on when the switching transistor M1 5 is turned off. In this condition, the shunting transistor M2 7 acts primarily as a resistor having a value of r. By design, the value of r is much less than the characteristic impedance of the RF source. Consequently, r greatly reduces the voltage at the input of the switching transistor M1 5. When the value of r is much less than the source resistance R0 9 and the feedthrough capacitive resistance of the shunting transistor M2 7, isolation is easily calculated. Switch isolation for the off state of the RF switch 10 is determined as the difference between the maximum available power at the input to the power at the output.

In addition to RF switch insertion loss and isolation, another important RF switch performance characteristic is the ability to handle large input power when the switch is turned on to ensure that insertion loss is not a function of power at a fixed frequency. Many applications require that the switch does not distort power transmitted through a "switched-on" switch. For example, if two closely spaced tones are concurrently passed through an RF switch, non-linearities in the switch can produce inter-modulation (IM) and can thereby create a false tone in adjacent channels. If these adjacent channels are reserved, for instance, for information signals, power in these false tones must be maintained as small as possible. The switch compression, or "1 dB compression point" ("P1dB"), is indicative of the switch's ability to handle power. The P1 dB is defined as the input power at which the insertion loss has increased by 1 dB from its low-power value. Or stated in another way, the 1 dB compression point is a measure of the amount of power that can be input to the RF switch at the input port before the output power deviates from a linear relationship with the input power by 1 dB.

Switch compression occurs in one of two ways. To understand how switch compression occurs, operation of the MOSFET transistors shown in the RF switch 10 of FIGS. 1a–1c are described. As is well known in the transistor design arts, MOSFETs require a gate-to-source bias that exceeds a threshold voltage, $V_t$, to turn on. Similarly, the gate-to-source bias must be less than $V_t$ for the switch to be off. $V_t$ is positive for "type-N" MOSFETs and negative for "type-P" MOSFETs. Type-N MOSFETs were chosen for the RF switch 10 of FIGS. 1a–1c. The source of a type-N MOSFET is the node with the lowest potential.

Referring again to FIG. 1c, if a transient voltage on the shunting transistor M2 7 results in turning on the shunting transistor M2 7 during part of an input signal cycle, input power will be routed to ground and lost to the output. This loss of power increases for increased input power (i.e., input signals of increased power), and thereby causes a first type of compression. The 1 dB compression point in the RF switch 10 is determined by the signal swing on the input at which point the turned-off shunting transistor M2 7 is unable to remain off. Eventually, a negative swing of the input falls below the potential of the M2 gate, as well as below ground (thus becoming the source). When this difference becomes equal to $V_t$, the transistor M2 7 begins to turn on and compression begins. This first type of compression is caused by the phenomenon of the turning on of a normally off gate in the shunt leg of the RF switch. Once the shunting transistor M2 7 turns on, power at the output node 3 no longer follows power at the switch input in a linear manner. A second type of RF switch compression occurs when the source and drain of the shunting transistor M2 7 break down at excessive voltages. For submicron silicon-on-insulator (SOI) devices, this voltage may be approximately only +1 VDC above the supply voltage. At breakdown, the shunt device begins to heavily conduct current thereby reducing the power available at the output.

FIG. 2 shows a simplified schematic of a prior art single pole double throw (SPDT) RF switch 20. As shown in FIG. 2, the prior art RF switch 20 minimally includes four MOSFET transistors 23, 24, 27 and 28. The transistors 23 and 24 act as "pass" or "switching" transistors (similar to the switching MOSFET transistor M1 5 of FIGS. 1a–1c), and are configured to alternatively couple their associated and respective RF input nodes to a common RF node 25. For example, when enabled (or switched "on"), the switching transistor 23 couples a first RF input signal "$RF_1$", input to a first RF input node 21, to the RF common node 25. Similarly, when enabled, the switching transistor 24 couples a second RF input signal "$RF_2$", input to a second RF input node 22, to the RF common node 25. The shunting transistors, 27 and 28, when enabled, act to alternatively shunt their associated and respective RF input nodes to ground when their associated RF input nodes are uncoupled from the RF common node 25 (i.e., when the switching transistor (23 or 24) connected to the associated input node is turned off).

As shown in FIG. 2, two control voltages are used to control the operation of the prior art RF switch. The control voltages, labeled "SW", and its inverse "SW_", control the operation of the transistors 23, 24, 27 and 28. The control voltages are arranged to alternatively enable (turn on) and disable (turn off) selective transistor pairs. For example, as shown in FIG. 2, when SW is on (in some embodiments this is determined by the control voltage SW being set to a logical "high" voltage level, e.g., "+Vdd"), the switching transistor 23 is enabled, and its associated shunting transistor 28 is also enabled. However, because the inverse of SW, SW_, controls the operation of the second switching transistor 24, and its associated shunting transistor 27, and the control signal SW_ is off during the time period that SW is on (in some embodiments this is determined by SW_ being set to a −Vdd value), those two transistors are disabled, or turned off, during this same time period. In this state (SW "on" and SW_ "off"), the $RF_1$ input signal is coupled to the RF common port 25 (through the enabled switching transistor 23). Because the second switching transistor 24 is turned off, the $RF_2$ input signal is blocked from the RF common port 25. Moreover, the $RF_2$ input signal is further isolated from the RF common port 25 because it is shunted to ground through the enabled shunting transistor 28. As those skilled in the transistor designs arts shall easily recognize, the $RF_2$ signal is coupled to the RF common port 25 (and the $RF_1$ signal is blocked and shunted to ground) in a similar manner when the SW control signal is "off" (and SW_ is "on").

With varying performance results, RF switches, such as the SPDT RF switch 20 of FIG. 2, have heretofore been implemented in different component technologies, including bulk complementary-metal-oxide-semiconductor (CMOS) and gallium-arsenide (GaAs) technologies. In fact, most high performance high-frequency switches use GaAs technology. The prior art RF switch implementations attempt to improve the RF switch performance characteristics described above, however, they do so with mixed results and with varying degrees of integrated circuit complexity and yields. For example, bulk CMOS RF switches disadvantageously exhibit high insertion loss, low compression, and poor linearity performance characteristics. In contrast, due to the semi-insulating nature of GaAs material, parasitic substrate resistances can be greatly reduced thereby reducing RF switch insertion loss. Similarly, the semi-insulating GaAs substrate improves switch isolation.

Although GaAs RF switch implementations offer improved performance characteristics, the technology has several disadvantages. For example, GaAs technology exhibits relatively low yields of properly functioning integrated circuits. GaAs RF switches tend to be relatively expensive to design and manufacture. In addition, although GaAs switches exhibit improved insertion loss characteristics as described above, they may have low frequency limitations due to slow states present in the GaAs substrate.

The technology also does not lend itself to high levels of integration, which requires that digital control circuitry associated with the RF switch be implemented "off chip" from the switch. The low power control circuitry associated with the switch has proven difficult to integrate. This is disadvantageous as it both increases the overall system cost or manufacture, size and complexity, as well as reducing system throughput speeds.

It is therefore desirable to provide an RF switch and method for switching RF signals having improved performance characteristics. Specifically, it is desirable to provide an RF switch having improved insertion loss, isolation, and compression. It is desirable that such an RF switch be easily designed and manufactured, relatively inexpensive to manufacture, lend itself to high levels of integration, with low-to-high frequency application. Power control circuitry should be easily integrated on-chip together with the switch functions. Such integration has been heretofore difficult to achieve using Si and GaAs substrates. The present invention provides such an RF switch and method for switching RF signals.

SUMMARY OF THE INVENTION

A novel RF switch circuit and method for switching RF signals is described. The RF switch circuit may be used in wireless applications, and may be fabricated in a silicon-on-insulator technology. In one embodiment the RF switch is fabricated on an Ultra-Thin-Silicon ("UTSi") substrate. In one embodiment the RF switch includes: an input for receiving an RF signal; a first switching transistor grouping connected to the input to receive the RF signal and connected to an RF common port, wherein the first switching transistor is controlled by a switching voltage (SW); a second switching transistor grouping connected to the first switching transistor grouping and the RF common port, wherein the second switching transistor is controlled by a switching voltage SW_, and wherein SW_ is the inverse of SW so that when the first switching transistor grouping is on, the second switching transistor grouping is off. The switching transistor groupings, when enabled, alternatively connect their respective RF input signals to the RF common port. In this embodiment the RF switch also includes shunting transistor groupings coupled to the switching transistor groupings and also controlled by the switching voltages SW and SW_. The shunting transistor groupings, when enabled, act to alternatively shunt their associated RF input nodes to ground thereby improving RF switch isolation.

The switching and shunting transistor groupings comprise one or more MOSFET transistors connected together in a "stacked" or serial configuration. Within each transistor grouping, the gates of the stacked transistors are commonly controlled by a switching voltage (SW or SW_) that is coupled to each transistor gate through respective gate resistors. The stacking of transistor grouping devices and gate resistors increases the compression point of the switch. The RC time constant formed by the gate resistors and the gate capacitance of the MOSFETs is designed to be much longer than the period of the RF signal, causing the RF voltage to be shared equally across the series connected devices. This configuration increases the 1 dB compression point of the RF switch.

A fully integrated RF switch is described that includes digital switch control logic and a negative power supply voltage generator circuit integrated together with the inventive RF switch. In one embodiment, the fully integrated RF switch provides several functions not present in prior art RF switches. For example, in one embodiment, the fully integrated RF switch includes a built-in oscillator that provides clocking input signals to a charge pump circuit, an integrated charge pump circuit that generates the negative power supply voltages required by the other RF switch circuits, CMOS logic circuitry that generates control signals to control the RF switch transistors, level-shifting and low current voltage divider circuits that provide increased reliability of the switch devices, and an RF buffer circuit that isolates RF signal energy from the charge pump and digital control logic circuits. Several embodiments of the charge pump, level shifting, voltage divider, and RF buffer circuits are described. The inventive RF switch provides improvements in insertion loss, switch isolation, and switch compression. In addition, owing to the higher levels of integration made available by the present inventive RF switch, RF system design and fabrication costs are reduced and reliability is increased using the present invention.

BRIEF DESCRIPTION OF THE DRAWINGS

FIG. 6b is an electrical schematic of one embodiment of the inverters used to implement the level shifter shown in FIG. 6a.

FIG. 7a is a voltage amplitude versus time plot of a digital input signal and corresponding output signal generated by the inventive level shifter of FIG. 6a; FIG. 7b is a simplified logic symbol for the inventive level shifter of FIG. 6a.

FIG. 8b is a simplified block diagram of the digital control input and interface to the RF buffer circuit of FIG. 8a.

FIG. 9a is an electrical schematic of one embodiment of a low current voltage divider (LCVD) circuit made in accordance with the present RF switch invention; FIG. 9b is a simplified logic symbol used to represent the voltage divider of FIG. 9a.

FIG. 10 is an electrical schematic of a second embodiment of a level shifting circuit using the low current voltage divider circuit of FIG. 9a in combination with the level shifting circuit of FIG. 6a.

FIGS. 11a and 11b are electrical schematics showing an alternative embodiment of the two-stage level shifter and RF buffer circuit of FIG. 8a.

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

The Inventive RF Switch

Figure 3:
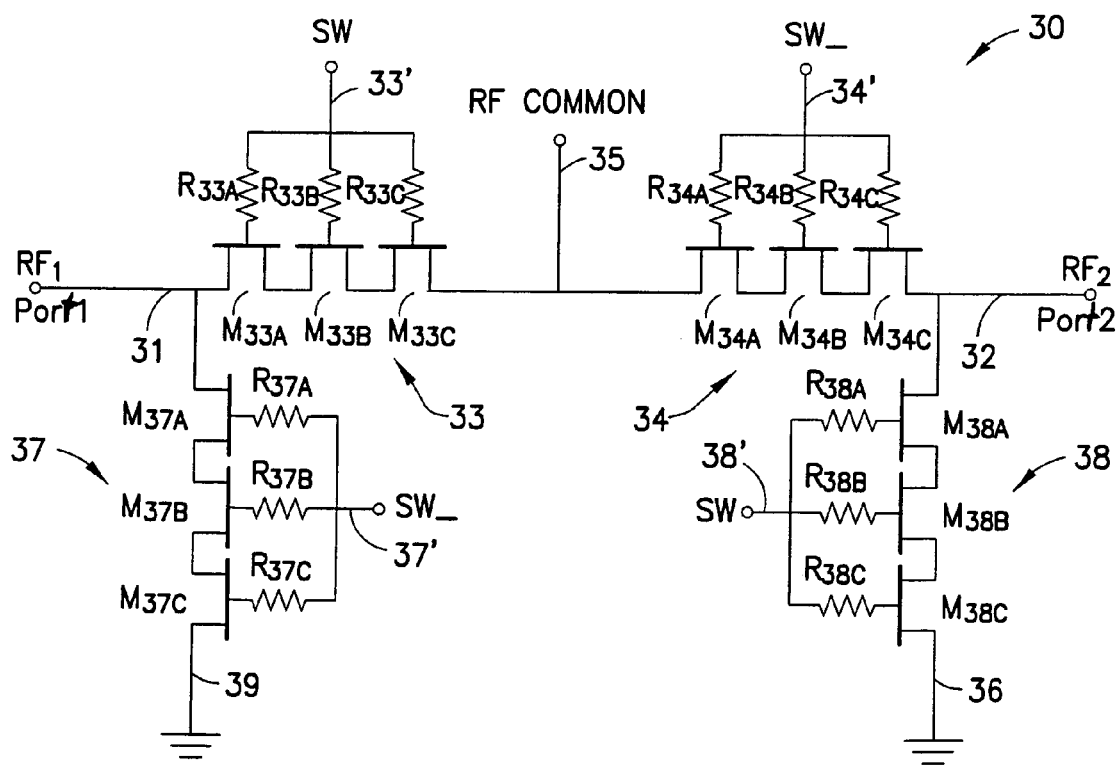
FIG. 3 is an electrical schematic of an RF switch according to one embodiment of the present invention.

The present invention is a novel RF switch design and method for switching RF circuits. A first exemplary embodiment of the present inventive RF switch 30 is shown in FIG. 3. As shown in FIG. 3, in one embodiment, the inventive RF switch 30 includes four clusters or "groupings" of MOSFET transistors, identified in FIG. 3 as transistor groupings 33, 34, 37 and 38. Two transistor groupings comprise "pass" or "switching" transistor groupings 33 and 34, and two transistor groupings comprise shunting transistor groupings 37 and 38. Each transistor grouping includes one or more MOSFET transistors arranged in a serial configuration. For example, in the embodiment shown in FIG. 3, the switching grouping 33 includes three switching transistors, $M_{33A}$, $M_{33B}$, and $M_{33C}$. Similarly, the switching grouping 34 includes three switching transistors, $M_{34A}$, $M_{34B}$, and $M_{34C}$. The shunting grouping 37 includes three transistors $M_{37A}$, $M_{37B}$, and $M_{37C}$. Similarly, the shunting grouping 38 includes three transistors, $M_{38A}$, $M_{38B}$, and $M_{38C}$. Although the transistor groupings 33, 34, 37 and 38 are shown in FIG. 3 as comprising three MOSFET transistors, those skilled in the RF switch design arts shall recognize that alternative grouping configurations can be used without departing from the scope or spirit of the present invention. For example, as described below in more detail, any convenient number of transistors can be used to implement the groupings shown in FIG. 3 without departing from the scope of the present invention.

In one embodiment of the present inventive RF switch, the MOSFET transistors (e.g., the transistors $M_{37A}$, $M_{37B}$, and $M_{37C}$) are implemented using a fully insulating substrate silicon-on-insulator (SOI) technology. More specifically, and as described in more detail hereinbelow, the MOSFET transistors of the inventive RF switch are implemented using "Ultra-Thin-Silicon (UTSi)" (also referred to herein as "ultrathin silicon-on-sapphire") technology. In accordance with UTSi manufacturing methods, the transistors used to implement the inventive RF switch are formed in an extremely thin layer of silicon in an insulating sapphire wafer. The fully insulating sapphire substrate enhances the performance characteristics of the inventive RF switch by reducing the deleterious substrate coupling effects associated with non-insulating and partially insulating substrates. For example, improvements in insertion loss are realized by lowering the transistor on resistances and by reducing parasitic substrate resistances. In addition, switch isolation is improved using the fully insulating substrates provided by UTSi technology. Owing to the fully insulating nature of silicon-on-sapphire technology, the parasitic capacitance between the nodes of the RF switch 30 are greatly reduced as compared with bulk CMOS and other traditional integrated circuit manufacturing technologies. Consequently, the inventive RF switch exhibits improved switch isolation as compared with the prior art RF switch designs.

As shown in FIG. 3, similar to the switch described above with reference to FIG. 2, the transistor groupings are controlled by two control signals, SW, and its inverse, SW_. The control signals are coupled to the gates of their respective transistors through associated and respective gate resistors. For example, the control signal SW controls the operation of the three transistors in the switching transistor grouping 33 ($M_{33A}$, $M_{33B}$, and $M_{33C}$) through three associated and respective gate resistors ($R_{33A}$, $R_{33B}$, and $R_{33C}$, respectively). The control signal SW is input to an input node 33' to control the switching transistor grouping 33. SW is also input to an input node 38' to control the shunting transistor grouping 38. Similarly, the inverse of SW, SW_, controls the switching transistor grouping 34 via an input node 34'. SW_ is also input to an input node 37' to control the shunting transistor grouping 37.

In one embodiment, the transistor grouping resistors comprise approximately 30 K ohm resistors, although alternative resistance values can be used without departing from the spirit or scope of the present invention. In addition, in some embodiments of the present invention, the gate resistors comprise any resistive element having a relatively high resistance value. For example, reversed-biased diodes may be used to implement the gate resistors in one embodiment. As described in more detail below, the gate resistors help to increase the effective breakdown voltage across the series connected transistors.

Figure 1A:
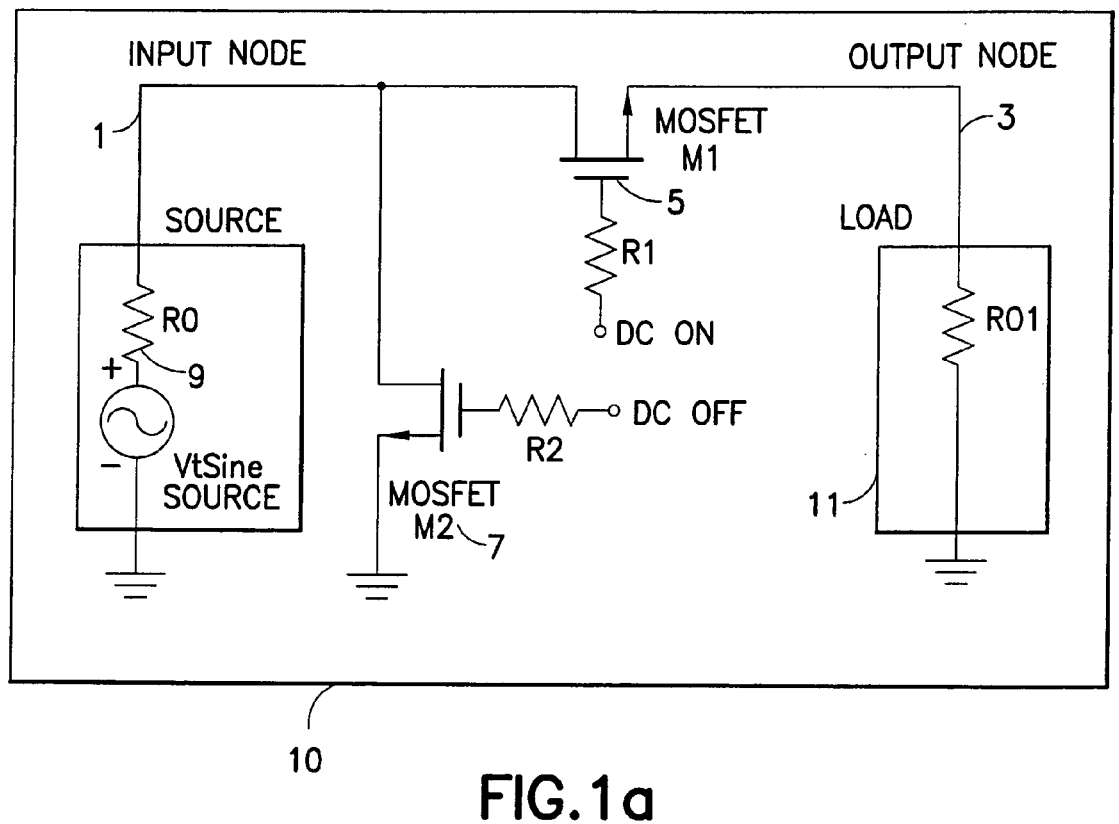
FIG. 1a is a simplified electrical schematic of a prior art single pole, single throw (SPST) RF switch used to demonstrate performance characteristics of the RF switch.
Figure 1B:
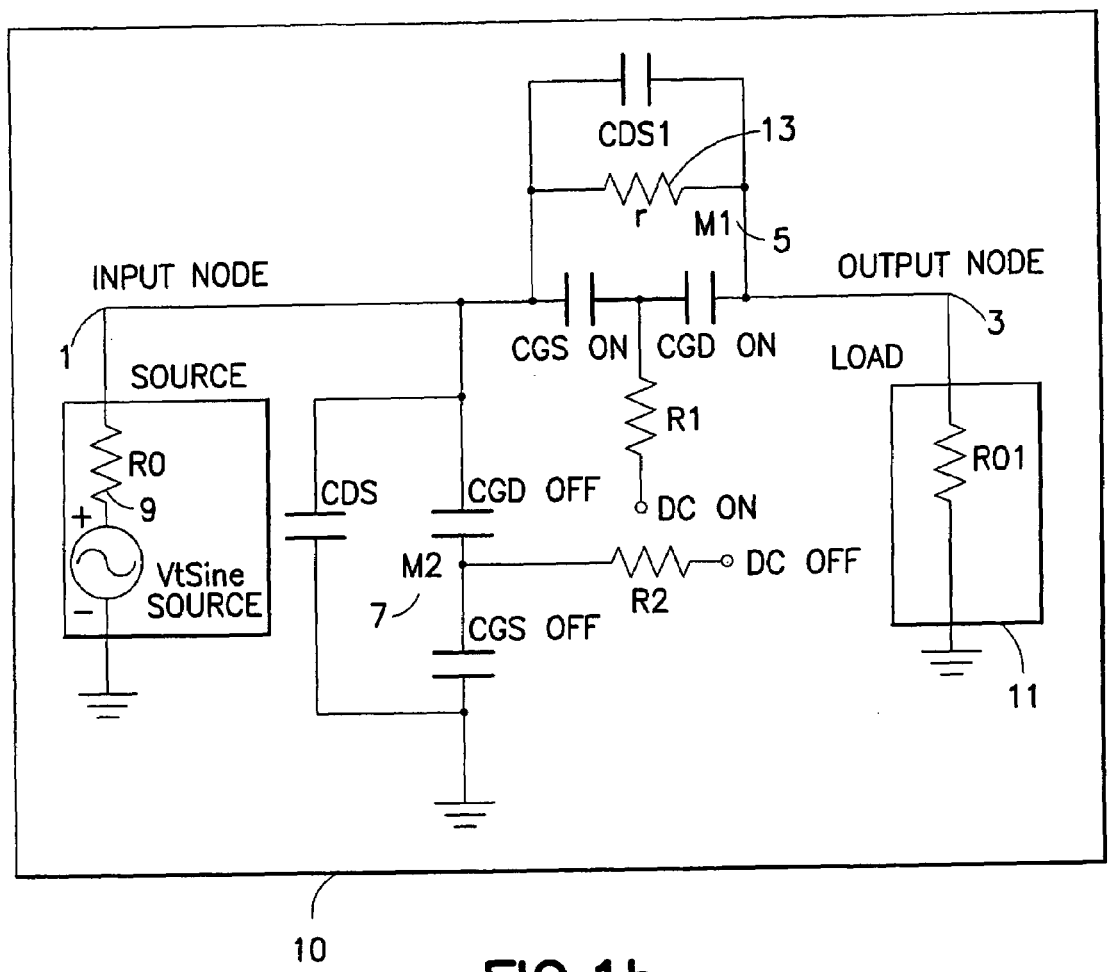
FIG. 1b is a simplified electrical schematic of the SPST RF switch of FIG. 1a showing the dominant characteristics of the switch when the switch is turned "on" allowing the RF signal to pass from an input node to an output node.
Figure 1C:
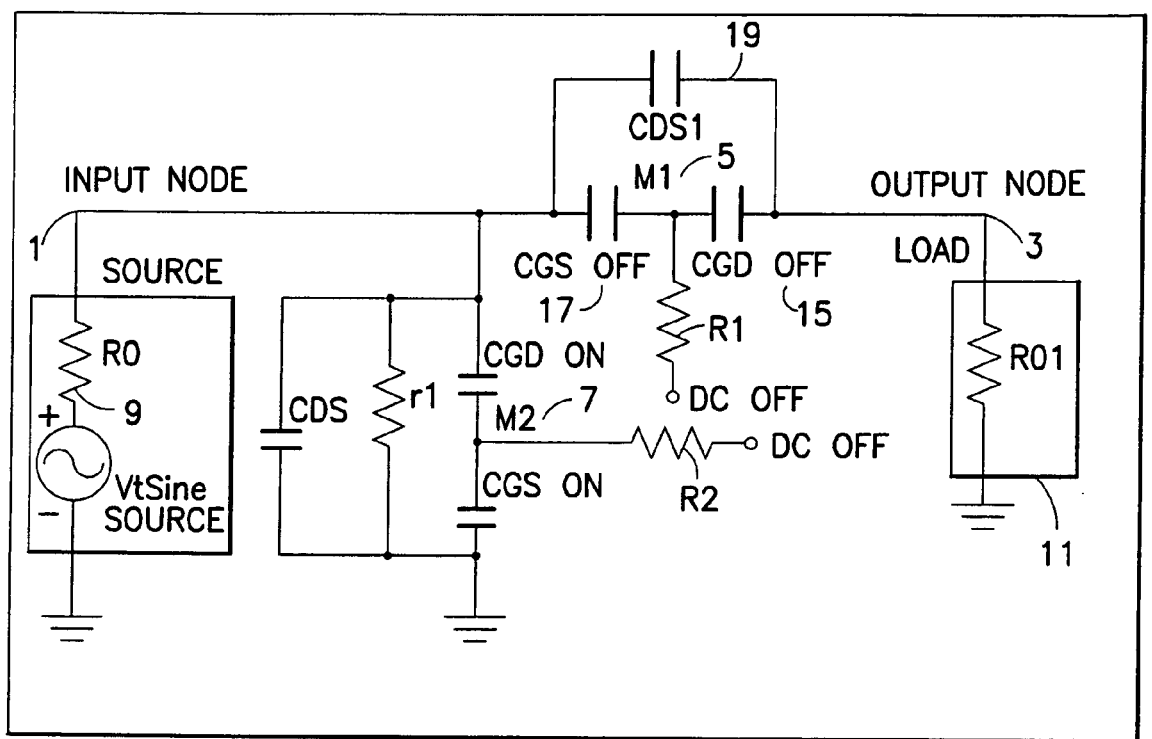
FIG. 1c shows the equivalent small-signal electrical characteristics of the RF switch of FIGS. 1a and 1b when the RF switch is turned "off" thereby blocking the RF signal from the output node.
Figure 2:
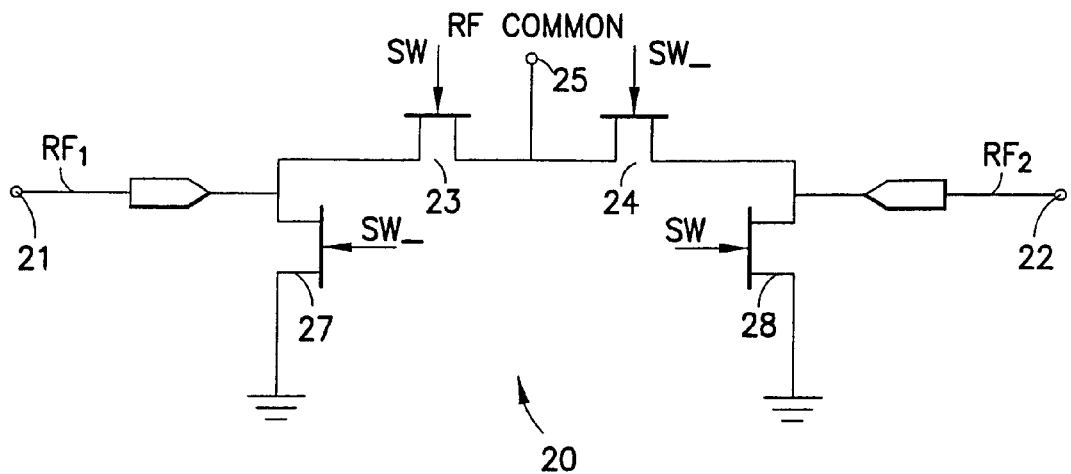
FIG. 2 is a simplified electrical schematic of a prior art single pole double throw (SPDT) RF switch.

The control signals function to control the enabling and disabling of the transistor groupings 33, 34, 37 and 38, and the RF switch 30 generally functions to pass and block RF signals in a manner that is similar to the control of the analogous transistors of the switch of FIG. 2. More specifically, the switching transistor groupings 33 and 34 act as pass or switching transistors, and are configured to alternatively couple their associated and respective RF input nodes to a common RF node 35. For example, when enabled, the switching transistor grouping 33 couples a first RF input signal "$RF_1$", input to a first RF input node 31, to the RF common node 35. Similarly, when enabled, the switching transistor grouping 34 couples a second RF input signal "$RF_2$", input to a second RF input node 32, to the RF common node 35. The shunting transistor groupings, 37 and 38, when enabled, act to alternatively shunt their associated and respective RF input nodes to ground when their associated RF input nodes are uncoupled from the RF common node 35 (i.e., when the switching transistor grouping (33 or 34) that is connected to the associated input node is turned off).

The control voltages are connected to alternatively enable and disable selective pairs of transistor groupings. For example, as shown in FIG. 3, when SW is on (in some embodiments this is determined when the control voltage SW is set to a logical "high" voltage level), the switching transistor grouping 33 is enabled (i.e., all of the transistors in the grouping 33 are turned on), and its associated shunting transistor grouping 38 is also enabled (i.e., all of the transistors in the grouping 38 are turned on). However, similar to the operation of the switch of FIG. 2, because the inverse of SW, SW_, controls the operation of the second switching transistor grouping 34, and its associated shunting transistor grouping 37, these two transistors groupings are disabled (i.e., all of the transistors in the groupings 34, 37 are turned off) during this time period. Therefore, with SW on, the $RF_1$ input signal is coupled to the RF common port 35. The $RF_2$ input signal is blocked from the RF common port 35 because the switching transistor grouping 34 is off. The $RF_2$ input signal is further isolated from the RF common port 35 because it is shunted to ground through the enabled shunting transistor grouping 38. As those skilled in the RF switch design arts shall recognize, the $RF_2$ signal is coupled to the RF common port 35 (and the $RF_1$, signal is blocked and shunted to ground) in a similar manner when the SW control signal is off (and the SW_ control signal is on).

One purpose of the stacking of MOSFET transistors and using gate resistors as shown in the inventive RF switch 30 of FIG. 3 is to increase the breakdown voltage across the series connected transistors. The RC time constant formed by the gate resistor and the gate capacitance of the MOSFETs is designed to be much longer than the period of the RF signal. Thus, very little RF energy is dissipated through the gate resistor. This arrangement effectively causes the RF voltage to be shared equally across the series connected transistors. The net effect is that the breakdown voltage across the series connected devices is increased to n times the breakdown voltage of an individual FET, where n is the number of transistors connected in series. This configuration increases the 1 dB compression point of the inventive RF switch 30.

To achieve improved switch performance, the RC time constant must be sized so that it is large with respect to the period of the RF signal. This largely places a constraint on the minimum value of R that can be used to implement the gate transistors. As noted above, in one embodiment of the present invention, a typical value of R is 30 k-ohms, although other resistance values can be used without departing from the scope of the present invention. Because a MOSFET gate input draws no DC current, there is no change in the biasing of the devices due to IR drops across this resistance.

Advantageously, the present inventive RF switch 30 can accommodate input signals of increased power levels. Owing to the serial arrangement of the MOSFET transistors that comprise the transistor groupings (33, 34, 37 and 38), increased power signals can be presented at the RF input nodes (i.e., at the input nodes 31 and 32) without detrimentally affecting switch operation. Those skilled in the transistor design arts art shall recognize that greater input power levels can be accommodated by increasing the number of transistors per transistor grouping, or by varying the physical configuration of the transistors. For example, in one embodiment, the transistors are approximately 0.5×2,100 micro-meters in dimension. However, alternative configurations can be used without departing from the scope or spirit of the present invention.

Silicon-on-Insulator (SOI) Technologies

As noted above in the description of the RF switch of FIG. 3, SOI technology is attractive in implementing RF switches due to the fully insulating nature of the insulator substrate. As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In order to achieve the desired switch performance characteristics described above, in one embodiment, the inventive RF switch is fabricated on a sapphire substrate.

Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, and providing that the conduction path of any inter-device leakage current must pass through the substrate.

An "ideal" silicon-on-insulator wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950° C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some preferred embodiments of the invention, the MOS transistors are formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating ultrathin silicon-on-sapphire integrated circuits can be used without departing from the spirit or scope of the present invention.

As described and claimed in these patents, high quality silicon films suitable for demanding device applications can be fabricated on insulating substrates by a method that involves epitaxial deposition of a silicon layer on an insulating substrate, low temperature ion implantation to form a buried amorphous region in the silicon layer, and annealing the composite at temperatures below about 950° C. Any processing of the silicon layer which subjects it to temperatures in excess of approximately 950° C. is performed in an oxidizing ambient environment. The thin silicon films in which the transistors are formed typically have an areal density of electrically active states in regions not intentionally doped which is less than approximately $5.\times10^{11}$ cm$^{-2}$.

As noted above, UTSi substrates are especially desirable for RF applications because the fully insulating substrate reduces the detrimental effects of substrate coupling associated with traditional substrates (i.e., substrates that are not fully insulating). Consequently, in one embodiment, the RF switch 30 of FIG. 3 is fabricated on an UTSi substrate.

RF Switch Design Tradeoffs

Several design parameters and tradeoffs should be considered in designing and implementing the inventive RF switch 30 described above with reference to FIG. 3. The inventive RF switch can be tailored to meet or exceed desired system design requirements and RF switch performance objectives. The design tradeoffs and considerations that impact the inventive RF switch design are now described.

As described above with reference to FIG. 3, the RF switch 30 is implemented using MOSFET transistors, which may be "N-type" or "P-type". However, N channel transistors are preferred for RF switches implemented in CMOS technology. N channel transistors are preferred because, for a given transistor size, the "on" resistance of an N channel transistor is much lower than for a P channel transistor due to the higher mobility in silicon of electrons versus holes. The control voltages are selected to insure that the on resistance of the "on" transistor is reduced. The control voltages are also selected to insure that the "off" transistor remains off when disabled.

As is well known in the transistor design arts, in an N channel MOS transistor, the "on" resistance is inversely proportional to the difference between the voltage applied at the transistor gate and the voltage applied at the transistor source. This voltage is commonly referred to as the "Vgs" (gate-to-source voltage). It is readily observed that as the magnitude of the RF signal (Vs) increases at the input port (e.g., at the first RF input node 31 of FIG. 3), and hence at the RF common port 35, the Vgs of the on transistors decrease (e.g., the Vgs of the transistor M33$_A$ in the switching transistor grouping 33 decreases as the magnitude of the RF 1 signal increases). This argues for making the gate control voltage (e.g., SW at the input node 33') as positive as possible. Unfortunately, reliability concerns limit the extent to which the gate control voltage can be made positive.

A similar concern exists for the "off" transistors. It is important to note that for typical RF switch applications, the RF input signals (e.g., the RF 1 input signal) generally swing about a zero reference voltage. The off transistors (e.g., the transistors in the shunting transistor grouping 37) must remain disabled or turned off during both the positive and negative voltage excursions of the RF input signal. This argues for making the gate control voltage of the off transistors (e.g., the SW_ control voltage signal) as negative as possible. Again, reliability concerns limit the extent to which this gate control voltage can be made negative.

For a CMOS switch, the design of the off transistor also limits the 1 dB compression point of the switch. As is well known in the transistor design arts, MOS transistors have a fundamental breakdown voltage between their source and drain. When the potential across the device exceeds this breakdown voltage, a high current flows between source and drain even when a gate potential exists that is attempting to keep the transistor in an off state. Improvements in switch compression can be achieved by increasing the breakdown voltage of the transistors. One method of fabricating a MOS transistor with a high breakdown voltage is to increase the length of the gate. Unfortunately, an increase in gate length also disadvantageously increases the channel resistance of the device thereby increasing the insertion loss of the device. The channel resistance can be decreased by making the device wider, however this also decreases the switch isolation. Hence, tradeoffs exist in MOS switch designs.

As described above with reference to the inventive RF switch 30 of FIG. 3, the transistors are stacked in a series configuration to improve the switch 1 dB compression point. The relatively high value gate resistors, in combination with the stacking configuration of the transistors in the transistor groupings, increase the effective breakdown voltage across the series connected transistors. The switch elements are designed and fabricated such that the RC time constant (determined by the resistance values of the gate resistors and the gate capacitance of the MOSFETs) is much longer than the period of the RF signal processed by the RF switch 30. As noted above, the net effect of the stacking configuration and the relatively high resistance gate resistors is to increase the breakdown voltage across the series connected transistors by a factor of n times the breakdown voltage of an individual transistor (where n equals the number of transistors connected in series in a transistor grouping).

An additional design consideration concerns the "body tie" used in traditional bulk CMOS transistors. As is well known in the transistor design arts, the body tie electrically couples the device either to the well or to the substrate. The well-substrate junction must remain reversed biased at all times. The source-to-body and drain-to-body junctions must remain reversed biased at all times. In general, for bulk CMOS designs, the well (for N-well technology) is tied to the most positive potential that will be applied to the circuit. The substrate (for P-well technology) is tied to the most negative potential that will be applied to the circuit. Because the RF input signal swings symmetrically above and below ground, bulk CMOS switch designs exhibit poor insertion loss, isolation, and 1 dB compression point performance. For these reasons, and those described above, the present RF switch 30 is preferably implemented on an insulating substrate.

Implementing the inventive RF switch on an insulating substrate provides several advantages such as improved switch isolation and reduced insertion loss. Further advantages are achieved by implementing the inventive RF switch using UTSi technology. For example, as compared with the prior art RF switch implementations in GaAs, improvements in integrated circuit yields, reduced fabrication costs, and increased levels of integration are achieved using UTSi. As is well known in the integrated circuit design arts, GaAs does not lend itself to high levels of integration. Thus, the digital control circuitry and other circuitry associated with the operation and function of the RF switch (such as a negative voltage power supply generator, level shifting, low current voltage divider and RF buffer circuits) must often be implemented off-chip (i.e., these functions are not easily integrated with the RF switch). This leads to increased costs and reduced performance of the prior art RF switch implementations.

In contrast, in accordance with the present RF switch invention, using UTSi technology, the circuitry necessary for the proper operation and functioning of the RF switch can be integrated together on the same integrated circuit as the switch itself. For example, and as described below in more detail, by implementing the RF switch in UTSi technology, the RF switch can be integrated in the same integrated circuit with a negative voltage generator and the CMOS control logic circuitry required to control the operation of the RF switch. The complexity of the RF switch is also reduced owing to the reduction in control lines required to control the operation of the switch. Advantageously, the RF switch control logic can be implemented using low voltage CMOS transistors. In addition, even for high power RF switch implementations, a single, relatively low power external power supply can be used to power the present inventive RF switch. This feature is advantageous as compared to the prior art GaAs implementations that require use of a relatively high power external power supply and power generation circuitry necessary to generate both positive and negative power supplies. For example, in the exemplary embodiments described below with reference to FIGS. 4–12, the present inventive RF switch requires only a single 3 V external power supply. The prior art switch designs typically require at least a 6 volt external power supply, and external voltage generation circuitry to generate both positive and negative power supplies.

Fully Integrated RF Switch

Figure 4:
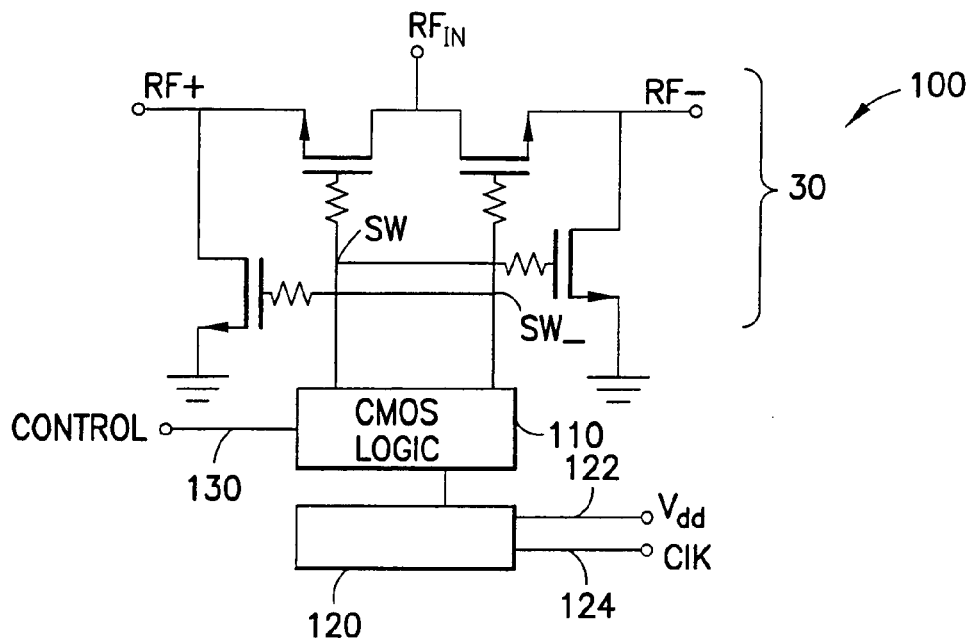
FIG. 4 is a simplified block diagram of an exemplary fully integrated RF switch made in accordance with the present invention.

FIG. 4 shows a simplified block diagram of an exemplary fully integrated RF switch 100 made in accordance with the present invention. As shown in FIG. 4, the fully integrated RF switch 100 includes the inventive RF switch 30 described above in FIG. 3 (shown in a simplified schematic representation in FIG. 4), CMOS control logic 110, and a negative voltage generator circuit 120 (implemented in one embodiment using a "charge pump" circuit). A control signal 130 is input to the CMOS logic block 110. In one embodiment, the control signal 130 ranges from 0 volts to +Vdd, however those skilled in the digital logic design arts shall recognize that other logic levels can be used without departing from the scope or spirit of the present invention. For the reasons provided above, in one exemplary embodiment, the fully integrated RF switch 100 is fabricated on UTSi substrates, although other insulating substrate technologies can be used.

As described in more detail below, the fully integrated RF switch 100 includes several functions and features not present in the prior art RF switch of FIG. 2. For example, in addition to the inventive RF switch 30 (which makes use of the novel transistor stacking and gate transistor configuration described above with reference to FIG. 3), the fully integrated RF switch 100 integrates the negative voltage generator and RF switch control functions together on the same integrated circuit as the inventive RF switch. As described below in more detail, the fully integrated RF switch 100 includes a built-in oscillator that provides clocking input signals to a charge pump circuit, an integrated charge pump circuit that generates the negative power supply voltages required by the other RF switch circuits, CMOS logic circuitry that generates the control signals that control the RF switch transistors, a level-shifting circuit that provides increased reliability by reducing the gate-to-drain, gate-to-source, and drain-to-source voltages of the switch transistors, and an RF buffer circuit that isolates RF signal energy from the charge pump and digital control logic circuits. Each of these circuits is described below in more detail with reference to their associated figures.

Negative Voltage Generator—Charge Pump—A First Embodiment

As shown in FIG. 4, one embodiment of the fully integrated RF switch 100 includes a negative voltage generator or charge pump 120. The negative voltage generator 120 generates the negative power supply voltage (specified hereafter as "–Vdd") required by other circuits of the fully integrated RF switch 100. Two sets of inputs are provided to the negative voltage generator 120: a positive DC power supply voltage signal (Vdd) 122; and a clocking input (shown in the figure as a single input signal, "Clk") 124. Although the clocking input 124 is shown as a single input signal in FIG. 4, as described below with reference to FIG. 5b, in some embodiments of the present inventive RF switch, the clocking input 124 may comprise two or more clock input signals.

In addition, in the embodiment shown in FIG. 4, the positive supply voltage that is input to the negative voltage generator circuit 120 comprises a 3 VDC power supply. However, other power supply levels may be used without departing from the scope or spirit of the present invention. For example, if desired, a 3.5 VDC, 5 VDC or any other convenient positive DC power supply can be input to the negative voltage generator circuit 120 of FIG. 4. The positive power supply signal is typically generated by an external low voltage power supply.

Figure 5A:
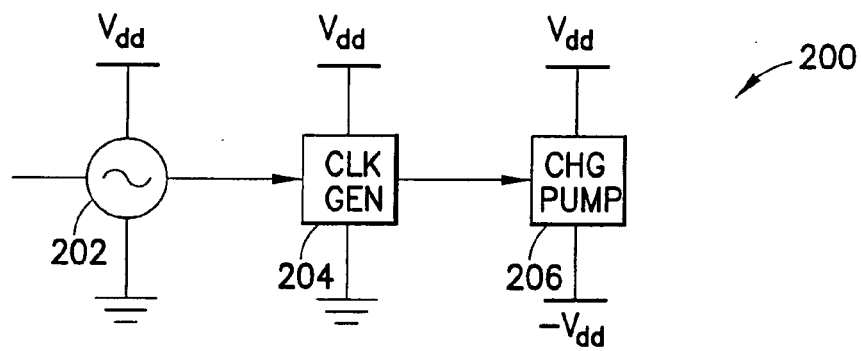
FIG. 5a is a simplified block diagram of one exemplary embodiment of the negative voltage generator shown in the simplified block diagram of FIG. 4.

In one embodiment of the present invention, the negative voltage generator 120 of FIG. 4 is implemented using a charge pump circuit. FIG. 5a shows a simplified block diagram of one exemplary embodiment 200 of the negative voltage generator 120 of FIG. 4. As shown in the simplified block diagram of FIG. 5a, the negative voltage generator includes an oscillator 202, a clock generator circuit 204, and an inventive charge pump circuit 206. The oscillator 202 output is input to the clock generator circuit 204. The output of the clock generator circuit 204 is input to the charge pump circuit 206. The negative voltage generator 120 provides the negative power supply voltage used by the other circuits of the fully integrated RF switch 100.

Many prior art RF switches disadvantageously require that the negative power supply voltages be generated by circuitry that is external to the RF switch circuitry. Other RF switch implementations use a coupling approach necessary to shift the DC value of the RF input signal to the midpoint of the applied bias voltage. This approach generally requires that relatively high bias voltages be applied because of the effective halving of the FET gate drive due to this level shifting. If the bias voltages are not increased, this produces a negative effect on the switch insertion loss because the gate drive is thereby reduced and the FET channel resistances are increased.

Figure 5B:
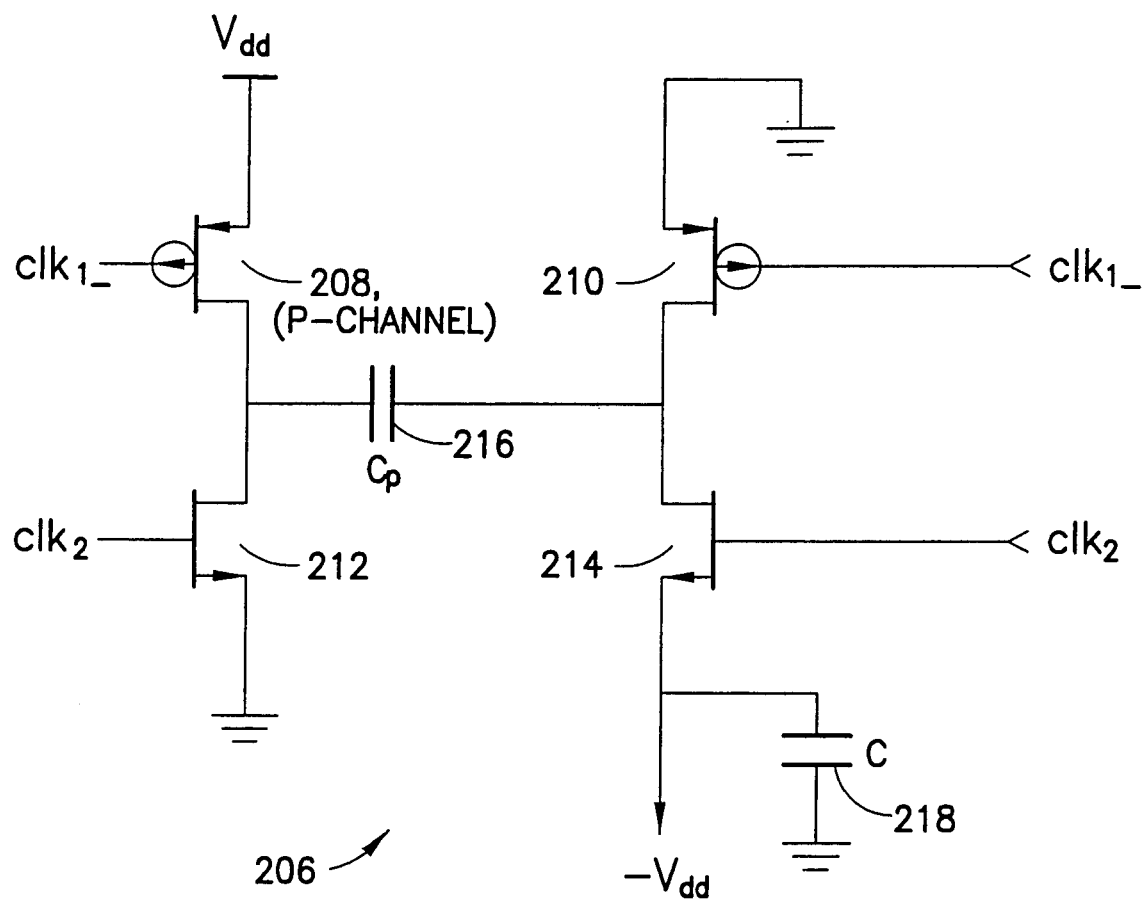
FIG. 5b is an electrical schematic of a first embodiment of a charge pump circuit that is used to generate a negative supply voltage to the RF switch of FIG. 4.

To address these problems, one embodiment of the fully integrated RF switch 100 uses the inventive charge pump circuit 206 shown in detail in FIG. 5b. As shown in FIG. 5b, a first embodiment of the charge pump circuit 206 includes two P-channel MOSFET transistors, 208 and 210, connected in series with two N-channel MOSFET transistors 212 and 214. The left leg of the charge pump circuit 206 (comprising the first P-channel transistor 208 connected in series with the first N-channel transistor 212) is coupled to the right leg of the charge pump circuit (comprising the second P-channel transistor 210 connected in series with the second N-channel transistor 214) using a first capacitor Cp 216. The source of the second P-channel transistor 214 is coupled to a second capacitor, an output capacitor, C 218, as shown. Two non-overlapping clock control signals, "Clk1" and "Clk2", are used to control the operation of the transistors 208, 210, 212 and 214. For example, as shown in FIG. 5b, the inverse of "Clk1", "Clk1_", control the gates of the P-channel transistors 208, 210. The other non-overlapping clock control signal, "Clk2", controls the gate of the N-channel transistors 212, 214, as shown.

The charge pump 206 generates a negative power supply voltage (−Vdd) by alternately charging and discharging the two capacitors (Cp 216 and the output capacitor C 218) using the non-overlapping clock input signals Clk1 and Clk2 to drive the transistor gates. The negative power supply voltage, −Vdd, is generated from the charge that is stored on the capacitor C 218. In one embodiment, a pulse shift circuit (not shown) is used to generate a pulse train that drives the charge pump (i.e., the pulse train is input as the clock input signals Clk1 and Clk2). As the pulse train is applied to the charge pump 206, the capacitor Cp 216 is applied the positive power supply Vdd and then discharged across the output capacitor C 218 in an opposite direction to produce the negative power supply voltage −Vdd. No transistor in the charge pump must standoff more than Vdd across any source/drain nodes, hence greatly increasing the reliability of the charge pump 206.

In one embodiment of the inventive charge pump circuit 206, the output C 218 has a capacitance of approximately 200 pF, and Cp 216 has a capacitance of approximately 50 pF. Those skilled in the charge pump design arts shall recognize that other capacitance values can be used without departing from the scope or spirit of the present invention.

In one embodiment, as shown in the simplified block diagram of FIG. 5a, the two non-overlapping clock signals are derived from an oscillator signal generated by an internal oscillator 202. As shown in FIG. 5a, the oscillator 202 inputs an oscillation signal to a clock generator circuit 204, which in turn, generates the two non-overlapping clock signals (in any convenient well known manner) that control the charge pump transistor gates. In one embodiment of the present inventive fully integrated RF switch 100, the oscillator 202 comprises a relatively low frequency (on the order of a few MHz) oscillator. In this embodiment, the oscillator comprises a simple relaxation oscillator. However, as those skilled in the integrated circuit arts shall recognize, other types of oscillators can be used to practice the present invention without departing from its spirit or scope.

Figure 5C:
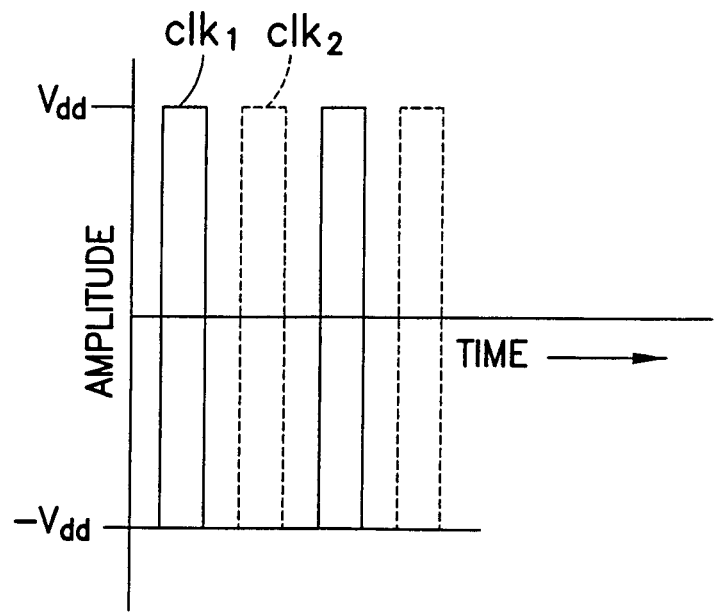
FIG. 5c is a plot of voltage amplitude versus time showing the voltage amplitude of two non-overlapping clock signals used to control the charge pump circuit of FIG. 5b varying over time.

FIG. 5c shows the voltage amplitude of the two non-overlapping clock signals, Clk1 and Clk2, varying over time. As shown in FIG. 5c, the two non-overlapping clock signals vary in voltage amplitude from −Vdd to +Vdd. In one embodiment, the clock signals vary from −3 VDC to +3 VDC. This arrangement improves the efficiency of the charge pump 206.

The charge pump transistors, 208, 210, 212 and 214 advantageously comprise single-threshold N-channel (212, 214) and P-channel (208, 210) devices. Previous charge pump circuits require use of multi-threshold level devices. These previous implementations are therefore more complex in design and cost than the inventive charge pump circuit 206 of FIG. 5b. In one embodiment of the present charge pump 206, the P-channel transistors 208, 210 have widths of approximately 20 micro-meters, and lengths of approximately 0.8 micro-meters. The N-channel transistors 212, 214 have widths of approximately 8 micro-meters, and lengths of approximately 0.8 micro-meters. Those skilled in the integrated circuit design arts shall recognize that other transistor dimensions can be used without departing from the scope or spirit of the present invention. The inventive charge pump circuit 206 is very efficient and performs well despite temperature and process variations.

Level Shifting Circuitry

Because the charge pump circuitry effectively doubles the power supply voltages that are applied to the circuit, careful attention must be paid to any potential reliability issues associated with these higher voltages. In order to implement the charge pump in a manner that increases the reliability of the transistors, level shifting circuitry is used to limit the gate-to-source, gate-to-drain, and drain-to-source voltages on the transistors to acceptable levels.

Figure 6A:
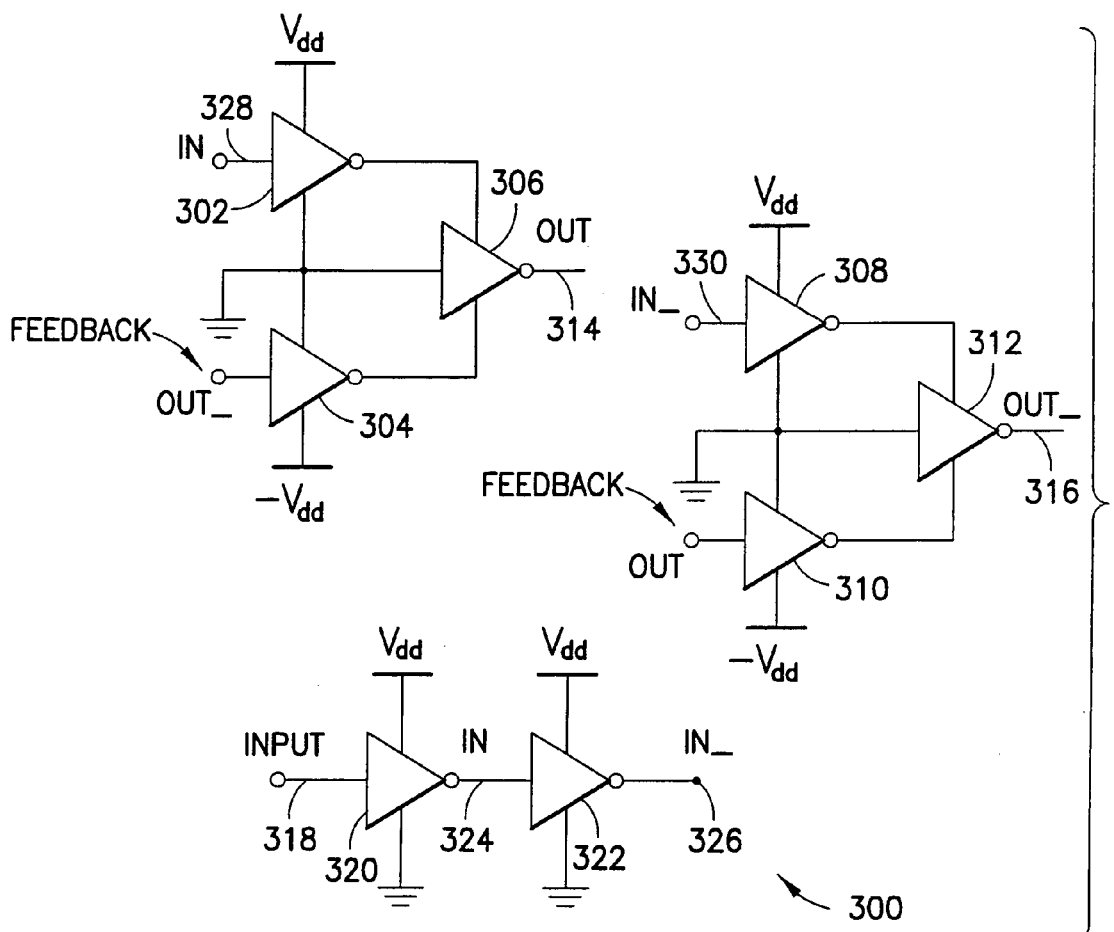
FIG. 6a is an electrical schematic of a first embodiment of an inventive level shifting circuit.

An inventive level shifting circuit 300 made in accordance with the present invention is shown in FIG. 6a. The level shifting circuit 300 is used to convert or shift typical or "normal" digital input signals (digital signals typically range from ground (GND) to +Vdd) such that they range from −Vdd to +Vdd. The reliability of the fully integrated RF switch transistors is thereby increased. In one embodiment of the present invention, the control signals are shifted to −3 VDC to +3 VDC, although those skilled in the RF switch control arts shall recognize that other level shifting voltage ranges can be used without departing from the spirit or scope of the present invention.

As shown in FIG. 6a, the inventive level shifting circuit 300, hereinafter referred to as the level shifter 300, comprises a plurality of inverters coupled in a feedback configuration. More specifically, in the embodiment shown in FIG. 6a, the level shifter 300 includes two groups of inverters used to generate first and second shifted output signals, "out" on a first output node 314, and its inverse "out_" on a second output node 316. The first group of inverters comprises inverters 302, 304 and 306. A second group of inverters comprises inverters 308, 310 and 312. A typical or "normal" digital input signal (i.e., a digital input signal that ranges from GND to +Vdd) is input to the level shifter 300 at an input node 318 of a first inverter 320. The first inverter 320 generates a first input signal "in" (on an output node 324) which is input to a second inverter 322.

The second inverter 322 generates a second input signal "in_", the inverse of the first input signal "in", on an output node 326. Therefore, 10 the first and second inverters, 320, 322, generate the signals that are input to the two groups of inverters described above. For example, the first input signal "in" is coupled to the input 328 of the inverter 302. Similarly, the second input signal "in_" is coupled to the input 330 of the inverter 308.

The output of the first group of inverters, "out", is generated by a first output inverter 306, and is provided on a first output node 314. The output of the second group of inverters, "out_", is generated by a second output inverter 312, and is provided on a second output node 316. The two level shifter outputs, "out" and "out_", are input to other circuits of the fully integrated RF switch 100 of FIG. 4. For example, in one embodiment, the first output, "out", is coupled to the gates of the devices of the switching transistor grouping 33 and the shunting transistor grouping 38 (i.e., the "out" signal on the first output node 314 of FIG. 6a is coupled to the "SW" control input signal of FIG. 3, at the input nodes 33' and 38', and thereby controls the operation of the switching transistor grouping 33 and the shunting transistor grouping 38 as described above with reference to FIG. 3). Similarly, in this embodiment, the second level shifter output, "out_", is coupled to the "SW_" control input signal of FIG. 3 (at the input nodes 34' and 37') and thereby controls the switching transistor grouping 34 and the shunting transistor grouping 37 as described above.

The level shifter 300 of FIG. 6a shifts the DC level of an input signal (i.e., the input signal provided on the input node 318) while leaving the frequency response of the input signal unchanged. The level shifter 300 takes full advantage of the floating technology offered by the silicon-on-insulator substrate implementation of the fully integrated RF switch 100. The inverters of the level shifter 300 operate on a differential basis, i.e., the level shifter shifts the digital input signals based upon the difference between two voltage signals. More specifically, as long as the difference between the power supply signals provided to the inverters (such as, for example, the output inverters 306 and 312) is on the order of Vdd, the level shifter 300 reliably functions to shift the input signals to a range between −Vdd to +Vdd. In one embodiment, Vdd is equal to 3 VDC. In this embodiment, the transistors comprising the inverters of the level shifter 300 (e.g., the output inverters 306 and 312) never have greater than 3 VDC applied across their source/drain nodes. This increases the reliability of the transistor devices.

Referring again to FIG. 6a, the level shifter uses a feedback approach to shift the digital input signals to voltage levels ranging from −Vdd to +Vdd. Specifically, the output of the second group of inverters (308, 310, 312) on the second output node 316 (i.e., the "out_" signal) is provided as feedback to an input of the first group of inverters at the input of the inverter 304. Similarly, the output of the first group of inverters (302, 304, 306) on the first output node 314 (i.e., the "out" output signal) is provided as input to the second group of inverters, specifically, is provided as input to the inverter 310.

When the digital input signal on the input node 318 reaches a logical "high" state (i.e., in some embodiments, when the input signal transitions from GND to +Vdd), the "in" signal (at the node 324) and the "in_" signal (at the node 326) go to ground (e.g., 0 VDC) and Vdd (e.g., 3 VDC), respectively. The "out" signal at the first output node 314 is driven to +Vdd. At the same time, the "out_" signal at the second output node 316 is driven towards −Vdd. The feedback (of "out_" fed back to the input of the inverter 304 and "out" fed forward to the input of the inverter 310) configuration ensures the rapid change in state of the level shifter 300. The level shifter 300 works similarly when the input signal transitions from a logic high to a logic low state (i.e., transitions from +Vdd to GND). When the digital input signal on the input node 318 reaches a logic "low" state, the "in" signal (at the node 324) and the "in_" signal (at the node 326) go to Vdd (e.g., 3 VDC), and ground, respectively. The "out" signal at the first output node 314 is driven to −Vdd. At the same time, the "out_" signal at the second output node 316 is driven towards +Vdd. The feedback again ensures the rapid change in state of the level shifter 300. The grounding contribution ensures that the level shifter inverters never see more than a full Vdd voltage drop across the source/drain nodes of the MOSFET transistors of the inverters.

Figure 6B:
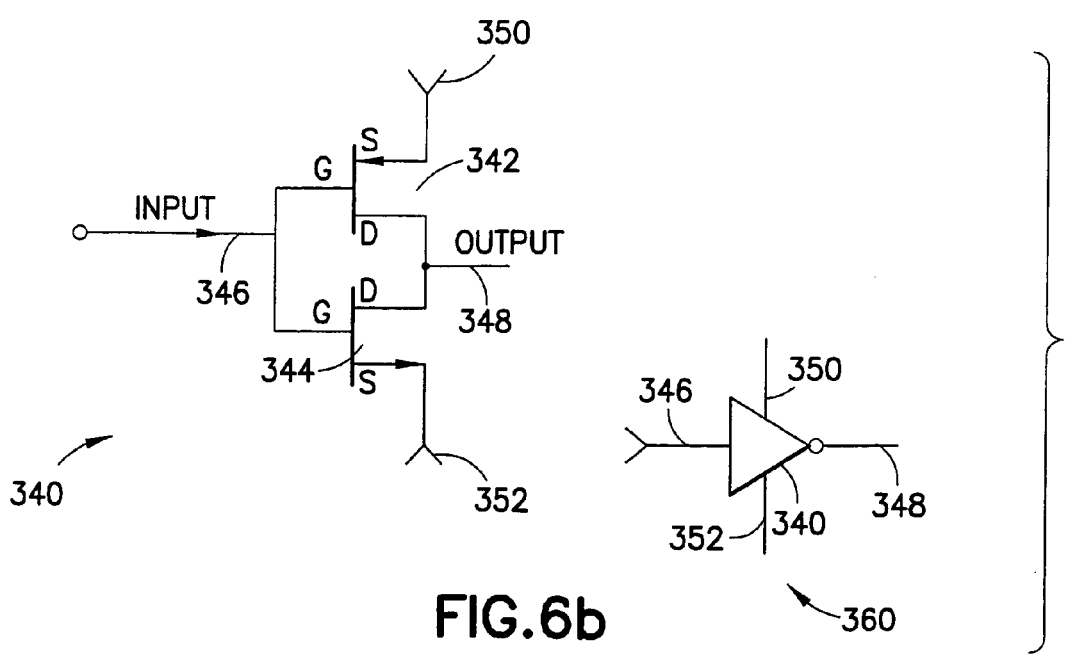

FIG. 6b shows one embodiment of the inverters (e.g., the inverters 302, 304, and 306) used to implement the level shifter 300 of FIG. 6a. As shown in FIG. 6b, the inverter 340 includes two MOSFET devices, a P-channel transistor 342 and an N-channel transistor 344. The devices are connected in series as shown, having their gates coupled together and controlled by an input signal provided at an input node 346. The source of the P-channel transistor 342 is coupled to a first power supply voltage signal at node 350, while the source of the N-channel transistor 344 is coupled to a second power supply voltage signal at a node 352. The device drains are coupled together as shown to produce an output of the inverter at an output node 348. In one embodiment of the present inventive inverter 340, the P-channel transistor 342 has a width of 5 micro-meters and a length of 0.8 micro-meters. In this embodiment, the N-channel transistor has a width of 2 micro-meters and a length of 0.8 micro-meters. Those skilled in the transistor design arts shall recognize that other physical dimensions can be used for the transistors of the inverter 340 without departing from the scope or spirit of the present invention. A logical representation of the inverter 340 is also shown as symbol 360 in FIG. 6b.

Figure 7A:
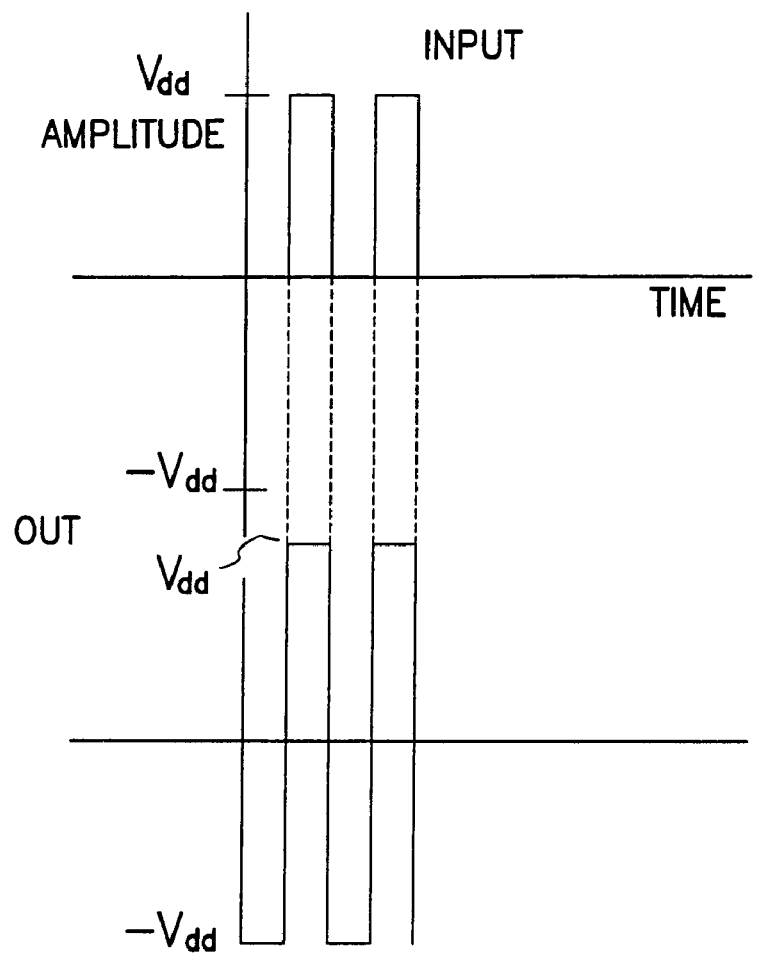

Thus, using the present inventive level shifter 300, digital input signals that initially range from GND to +Vdd are shifted to range from −VDD to +Vdd. FIG. 7a shows a voltage amplitude versus time plot of the digital input signal and the corresponding output signal that is generated by the inventive level shifter 300 of FIG. 6a. As shown in FIG. 7a, the digital input signal ranges from ground, or 0 VDC to Vdd. The output of the inventive level shifter 300 ranges from −VDD to +Vdd. In one embodiment of the present inventive RF switch, the input signal ranges from 0 VDC to +3 VDC, and the output of the level shifter 300 ranges from −3 VDC to +3 VDC. Other values of power supply voltages can be used without departing from the scope or spirit of the present invention. For example, in one embodiment, the input signal can range from 0 to +3.5 VDC, or from 0 to 4 VDC. In this embodiment, the level shifter shifts the signal to range from −3.5 (or −4) VDC, to +3.5 (or +4) VDC.

Figure 7B:
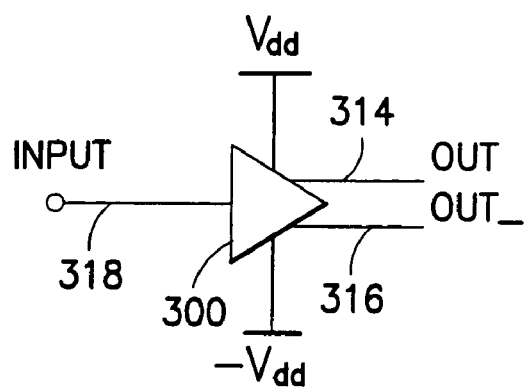

FIG. 7b shows a simplified logic symbol for the inventive level shifter 300 of FIG. 6a. This logic symbol is used in subsequent figures. As shown in FIG. 7b, the digital input signal is provided on the input node 318 (the same input node 318 described above with reference to FIG. 6a). The level shifter 300 provides two shifted outputs, "out" and its inverse "out_", and these are provided on output nodes 314 and 316, respectively (the same output nodes 314, 316 described above with reference to FIG. 6a).

RF Buffer Circuit

Figure 8B:
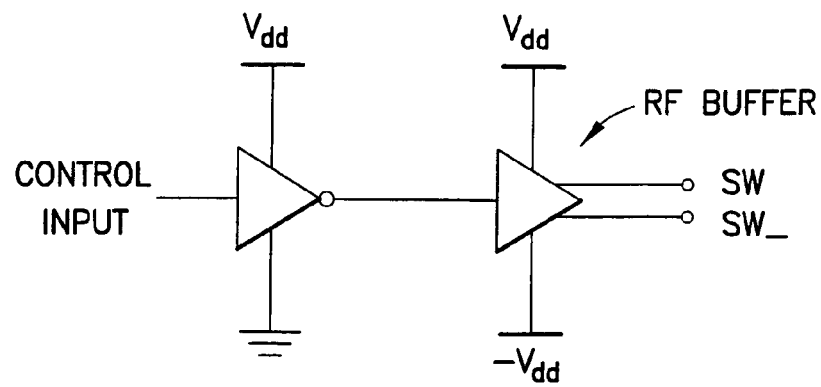
Figure 8A:
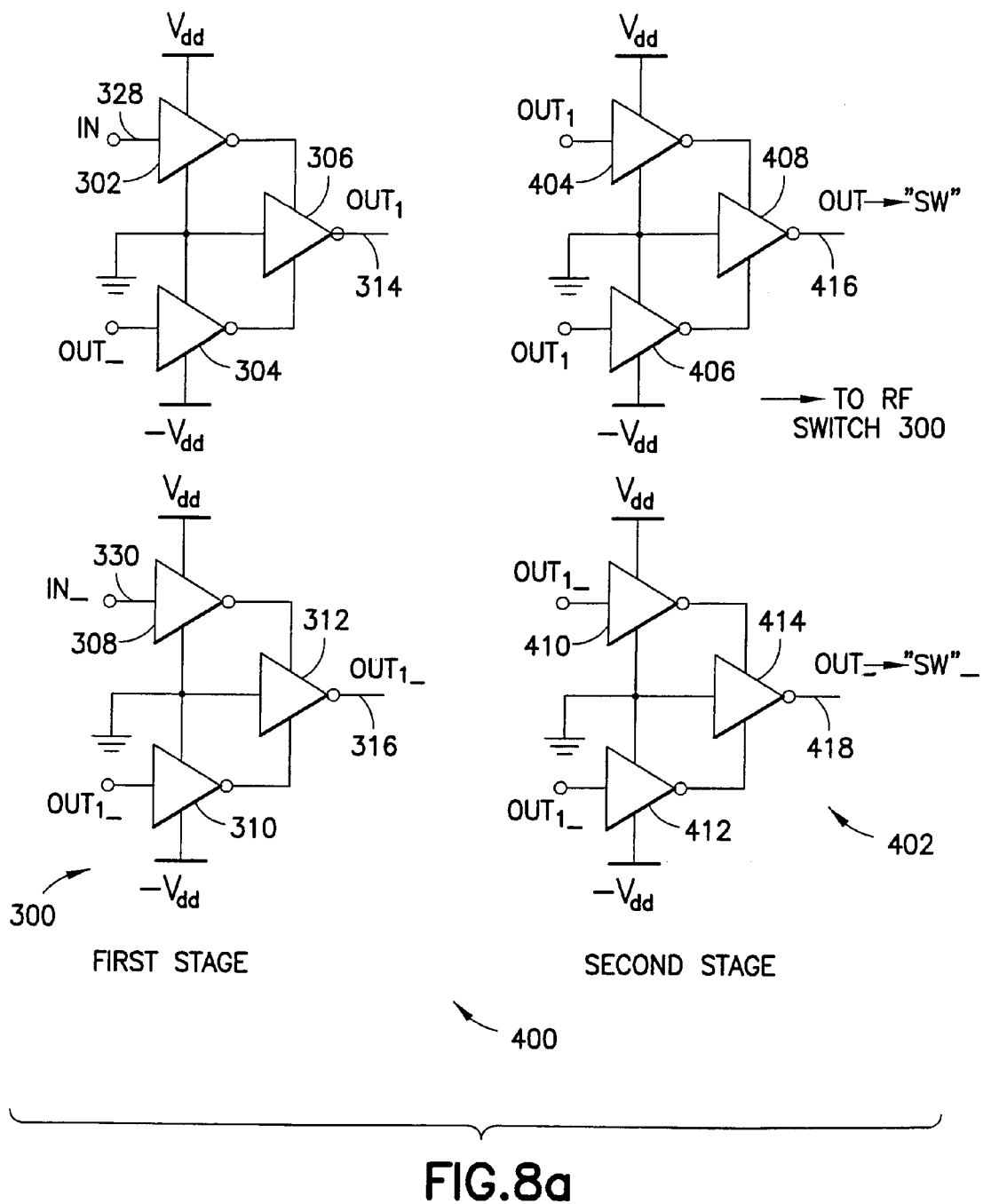
FIG. 8a is an electrical schematic of one embodiment of a two-stage level shifter and RF buffer circuit including a first stage level shifter and a second stage RF buffer circuit.

FIG. 8a is an electrical schematic of a two-stage level shifter and RF buffer circuit 400.

FIG. 8b is a simplified block diagram of the digital control input and interface to the RF buffer circuit 400. The two-stage level shifter and RF buffer circuit 400 of FIG. 8a comprises a first stage level shifter 300 and a second stage RF buffer circuit 402. The first stage level shifter 300 is identical to that described above with reference to FIGS. 6a, 6b, 7a and 7b, and is therefore not described in more detail here. As described above, the level shifter stage 300 shifts the logic levels of the digital control signals to range from −VDD and +Vdd. The second stage of the circuit 400 comprises the RF buffer circuit 402. The RF buffer circuit 402 acts as a driver stage only (i.e., no level shifting is performed by the RF buffer circuit).

The RF buffer electrically isolates the digital control signals (such as those generated by the CMOS logic block 110 of FIG. 4) from the RF switch 30 described above with reference to FIG. 3. The RF buffer 402 functions to inhibit drooping of the control voltages (SW, SW_, which are also referred to herein and shown in FIG. 8a as the control signals "out" and "out_, respectively) that control the enabling and disabling of the transistors in the RF switch 30. As described below in more detail, the RF buffer 402 also functions to prevent coupling of large power RF signals to the negative power supply (i.e., −VDD) that is generated by the charge pump circuit 206 described above with reference to FIGS. 5a-5c. More specifically, the RF buffer 402 prevents large power RF signals extent in the RF switch 30 from RF-coupling to, and thereby draining current from, the negative power supply generated by the charge pump 206 (FIG. 5b).

When very large power RF input signals are input to the inventive RF switch 30, coupling of the RF signals to the digital logic signals can occur unless an RF buffer circuit is used to isolate the digital logic signals from the RF switch. The RF coupling can and usually will detrimentally affect the RF transistor control signals (SW and SW_). For example, when RF input signals on the order of approximately 30 dBm are input to a 1 watt RF switch 30, RF coupling can cause voltage swings of several tenths of a volt on the digital control lines. This is due to the feedback of RF signals from the RF switch through to the digital control circuitry. This RF coupling effect can adversely affect the enabling and disabling of the RF transistor groupings and hence the proper operation of the RF switch 30. The buffer circuit 402 of FIG. 8a prevents the undesirable RF coupling effect.

As shown in FIG. 8a, the inventive buffer circuit 402 is very similar in configuration to the level shifter 300 described above and shown as the first stage of the two-stage circuit 400. Similar to the level shifter 300, the RF buffer 402 comprises two groups of inverters, a first group of inverters (404, 406 and 408) and a second group of inverters (410, 412, and 414). The output of the first group of inverters (404, 406, and 408), generated by the first output inverter 408, is labeled "out" in the figure and is provided at a first output node 416. The output of the second group of inverters (410, 412, and 414), generated by the second output inverter 414, is labeled "out_", and is provided at a second output node 418. The output signal "out_" is the inverse of the output signal "out".

Importantly, although the first stage level shifter 300 uses feedback to perform the level shifting function (as described above with reference to FIG. 6a), the RF buffer circuit 402 does not feedback its output signals to the input. Consequently, the digital input signals input to the first stage (i.e., the control input signals that are input to the level shifter 300 at the nodes 328 and 330) are isolated from the output signals that are used to control the RF switch transistors (i.e., the control output signals "out" and its inverse signal "out_" at the output nodes 416 and 418, respectively, and coupled to the SW and SW_ control signal lines, respectively).

More specifically, and referring again to FIG. 8a, the level shifter 300 inputs the digital control signals "in" and its inverse signal "in_" at the nodes 328, 330 respectively (as described in more detail above with reference to FIG. 6a). The first output of the level shifter 300, "out1", at the output node 314, is fed back to the input of the inverter 310 as shown. Similarly, the second output of the level shifter 300, "out1_", at the output node 316, is fed back to the input of the inverter 304. As described above, because of this feedback topology, RF coupling occurs (i.e., the level shifter output signals have RF signals superimposed thereon) if the output signals of the level shifter are used to directly control the RF switch transistors (i.e., in the absence of the buffer circuit 402). Therefore the inventive RF buffer circuit 402 is used without feedback of the output signals to isolate the input signals (i.e., the digital input signals "in" and "in_) from the RF signals present in the RF switch. As shown in FIG. 8a, the first output signal "out1" of the level shifter 300 is input to the inverters 404, 406 of the RF buffer circuit. Similarly, the second output signal "out1_" of the level shifter 300 is input to the inverters 410, 412 of the buffer circuit. The two control outputs of the RF buffer circuit 402 ("out" and "out_") control the enabling and disabling of the transistors of the RF switch and are not provided as feedback to the level shifter. Hence, improved isolation between the RF switch and the digital logic circuitry is achieved.

In one embodiment, the inverters used to implement the two-stage level shifter and RF buffer circuit 400 comprise the inverter 340 described above with reference to FIG. 6b. However, those skilled in the inverter design arts shall recognize that alternative inverter designs can be used in implementing the two-stage circuit 400 without departing from the scope or spirit of the present invention. In one embodiment, the transistors used to implement the first stage level shifter 300 are physically smaller than those used to implement the second stage RF buffer circuit 402. Larger dimension transistors are used in the RF buffer circuit 402 to achieve an efficient amplification of the control signals. For example, in one embodiment, the transistors used to implement the RF buffer are three times wider than those used to implement the level shifter 300, resulting in an amplification of approximately three times the current. Those skilled in the transistor design arts shall recognize that other convenient transistor dimensions can be used to achieve any desired amplification of the digital control signals.

Figures 9A, 9B:
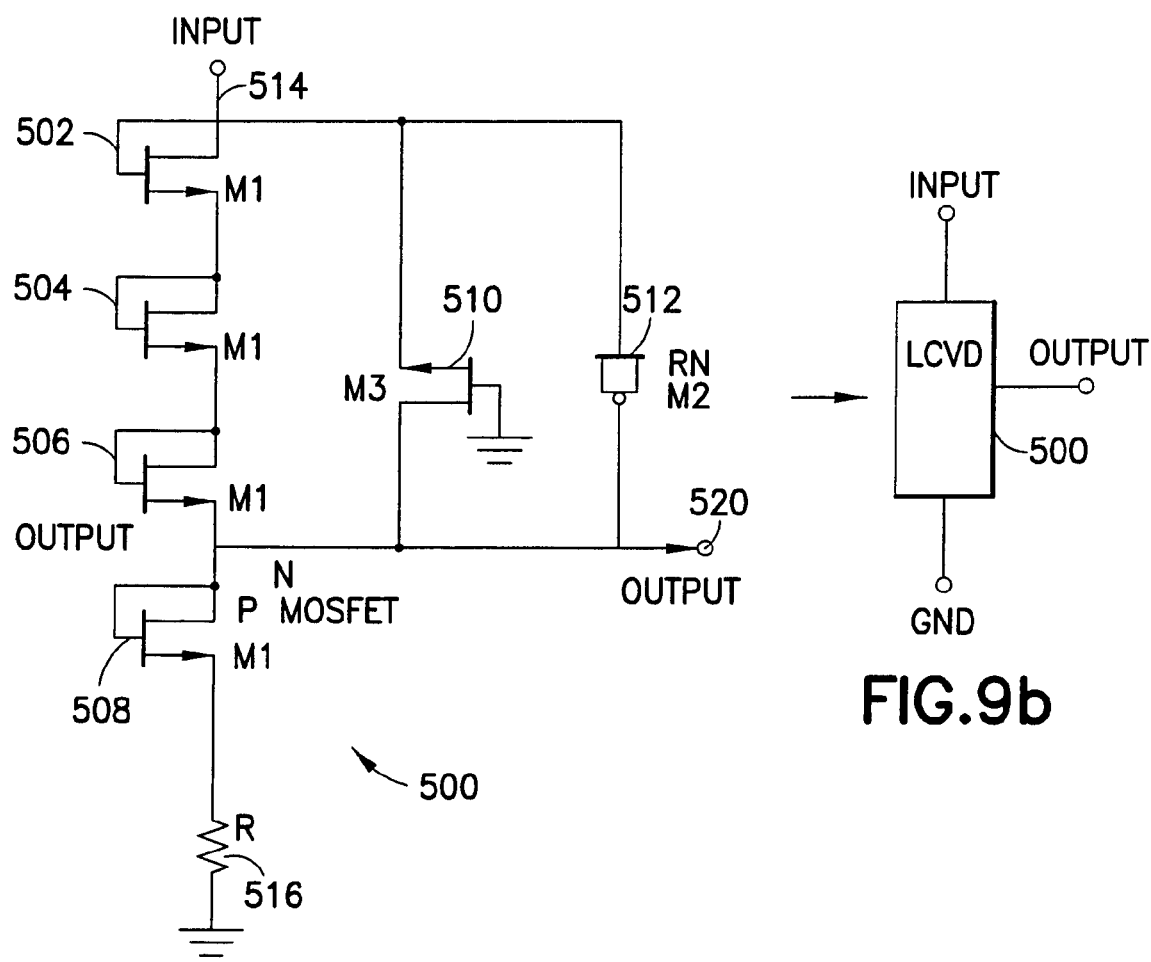

Voltage Divider for Use in an Alternative Level Shifting Circuit of the Present Invention FIG. 9a is an electrical schematic of one embodiment of a low current voltage divider ("LCVD") circuit 500 that is used in the feedback path of one embodiment of the level shifter 300 described above with reference to FIG. 6a. FIG. 9b shows a simplified logic symbol that is used to represent the voltage divider 500 of FIG. 9a. The voltage divider 500 is used in one embodiment to address potential gate oxide reliability issues related to excessive voltage swings across the gate oxides of the feedback inverter transistors. As described above with reference to the level shifter 300, although the source-to-drain voltages of the various MOSFETs used to implement the level shifter are never applied voltages greater than Vdd, because the outputs of the level shifter (i.e., the output signals "out" and "out_) can swing as much as 2*Vdd (i.e., from −VDD to +Vdd), the gate oxides of the feedback inverters 304 and 310 can have applied voltages of 2*Vdd. These feedback voltage levels can be applied across the gate oxides of the feedback inverters 304, 310, and can result in gate oxide reliability problems.

The gate oxide reliability issues can be averted by ensuring that the maximum voltage applied across the gate oxide of the feedback inverters 304, 310 is lowered to approximately Vdd (as contrasted with gate oxide voltages of 2*Vdd). Therefore, in one embodiment of the present inventive fully integrated RF switch, the voltage divider of FIG. 9a limits the voltages applied to the gates of the level shifter feedback inverters 304, 310. In this embodiment, instead of directly feeding back the level shifter outputs to their respective feedback inverters as shown in the level shifter of FIG. 6a (i.e., the outputs "out" and "out_", at the output nodes 314, 316, respectively), the level shifter output signals are first conditioned by the voltage divider 500 of FIG. 9a before being fed back to the feedback inverters. As described below in more detail, the voltage divider 500 ensures that the voltages applied to the gate oxides of the feedback inverters 304, 310 do not exceed more than approximately Vdd plus a small voltage drop (the voltage drop being a function of the number of transistors used to implement the voltage divider 500 and a transistor threshold voltage). In one embodiment Vdd is 3 VDC, and the voltage drop is 0.9 VDC. In this embodiment, the voltage divider 500 ensures that the gate oxides are never applied voltages exceeding approximately 3.9 VDC (i.e., the feedback inverters are applied voltages that range from −3 VDC to 0.9 VDC).

Referring now to FIG. 9a, the voltage divider 500 includes a plurality of MOSFET devices (502, 504, 506 and 508) coupled together in a serial configuration (i.e., stacked on top of each other in a source to drain arrangement as shown). In one embodiment, the gate and drain of the MOSFETs 502, 504, 506 and 508 are coupled together to implement stacked diodes. The diode-implementing MOSFETs, hereafter referred to as "diode devices", are stacked in series as shown. The voltage divider 500 also includes a MOSFET M3 510 and an output MOSFET M2 512. The function of these two transistors is described in more detail below.

The diode devices are used to divide the voltage of an input signal provided to the voltage divider 500 at an input node 514. As shown in FIG. 9a, the signal that is divided by the voltage divider 500 is provided as input to the drain (and connected gate) of the first device 502. Once the input signal exceeds a positive voltage level of (n*Vthn), where "n" is the number of diode devices used to implement the voltage divider 500, and Vthn is the threshold voltage of the device (i.e., the "diode-drop" from the drain to the source of the device), the diode devices (502, 504, 506, and 508) begin to conduct current heavily. In the embodiment shown in FIG. 9a, n=4, and Vthn =0.7 volts, although alternative values for "n" and Vthn 30 can be used without departing from the scope or spirit of the present invention. For example, in other embodiments, the input signal provided to the divider can be limited to any desired voltage level by varying the number of diode devices used to implement the voltage divider 500 (i.e., by varying the value of "n"). In the embodiment shown in FIG. 9a, once the input voltage exceeds a voltage level of (4*0.7), or 2.8 volts, the stacked diode devices begin conducting heavily.

A ballast resistor, R 516, is connected to the source of the output diode device 508 as shown. Once the diode devices turn on fully, the ballast resistor R 516 drops any additional input voltage that exceeds the value of n*Vthn. In the embodiment shown in FIG. 9a, the ballast resistor R 516 drops any additional input voltage exceeding the value of (input voltage−(4*Vthn)). The output of the voltage divider 500 is tapped from the connected gate-drain of the output diode device 508. The voltage-divided output signal is provided on an output node 520. Due to the diode voltage drops of the diode devices 502, 504, 506, (i.e., 3*Vthn), and the voltage dropped across the ballast resistor R 516, the output at the output node 520 is guaranteed to never exceed approximately (input voltage−(3*Vthn)). For Vthn=approximately 0.7 volts, and a maximum input voltage of approximately 3 volts, the output node 520 will never exceed (3 VDC−(3*0.7 VDC)), or 0.9 VDC. Thus, in the embodiment shown in FIG. 9a, for an input voltage ranging between −3 VDC to +3 VDC, the voltage divider 500 limits the output of the output node 520 to a range of −3 VDC to 0.9 VDC.

The output MOSFET M2 512 is configured as a capacitor and is used to assist in accelerating the switching time of the voltage divider 500. The MOSFET M3 510 assures that the output node 520 swings to the potential of the input signal at the input node 514 when the input goes to a negative potential. This is accomplished by the device M3 510 turning on when the input signal goes to a negative potential. Thus, when the input signal goes to a −VDD potential (e.g., −3 VDC), the output signal at the output node 520 also goes to −VDD. The output device 508 is reversed biased during negative voltage swings of the input signal assuring that no DC current is drained from the negative power supply during the negative voltage swings of the input signal. When the voltage divider output is approximately −3 VDC, the voltage divider 500 draws no current. This is important because a current at −3 VDC discharges the charge pump circuit described above with reference to FIG. 5b. When the voltage divider output is approximately 0.9 volts, the current that is drawn is very small if the ballast resistor R 516 is selected to be relatively large. However, because the current in this case occurs between a positive voltage (0.9 volts) and ground, no additional charge pump current is delivered due to the operation of the voltage divider 500 of FIG. 9a.

In one embodiment, the ballast resistor R 516 has a value of 100 k-ohms. In one embodiment all of the devices of the voltage divider 500 have the same length. For example, in one embodiment, all of the devices have a length of 0.8 micro-meters. In one embodiment, all of the diode devices (502, 504, 506, and 508) have identical physical dimensions. In one embodiment, the diode devices each have a width of 2 micro-meters, the device M3 510 has the same width of 2 micro-meters, and the output MOSFET M2 512 has a width of 14 micro-meters. Those skilled in the integrated circuit design arts shall recognize that other values and alternative configurations for the devices shown in FIG. 9a can be used without departing from the scope or spirit of the present invention. For example, those skilled in the electrical circuit design arts shall recognize that other voltage divider output levels can easily be accommodated by varying the number "n" of diode elements, varying the values of Vthn, or by tapping the output node 520 at a different point in the stack of diode devices (e.g., by tapping the output from the drain of diode device 506, or 504, instead of from the drain of device 508 as shown).

Modified Level Shifter using the Voltage Divider

Figure 10:
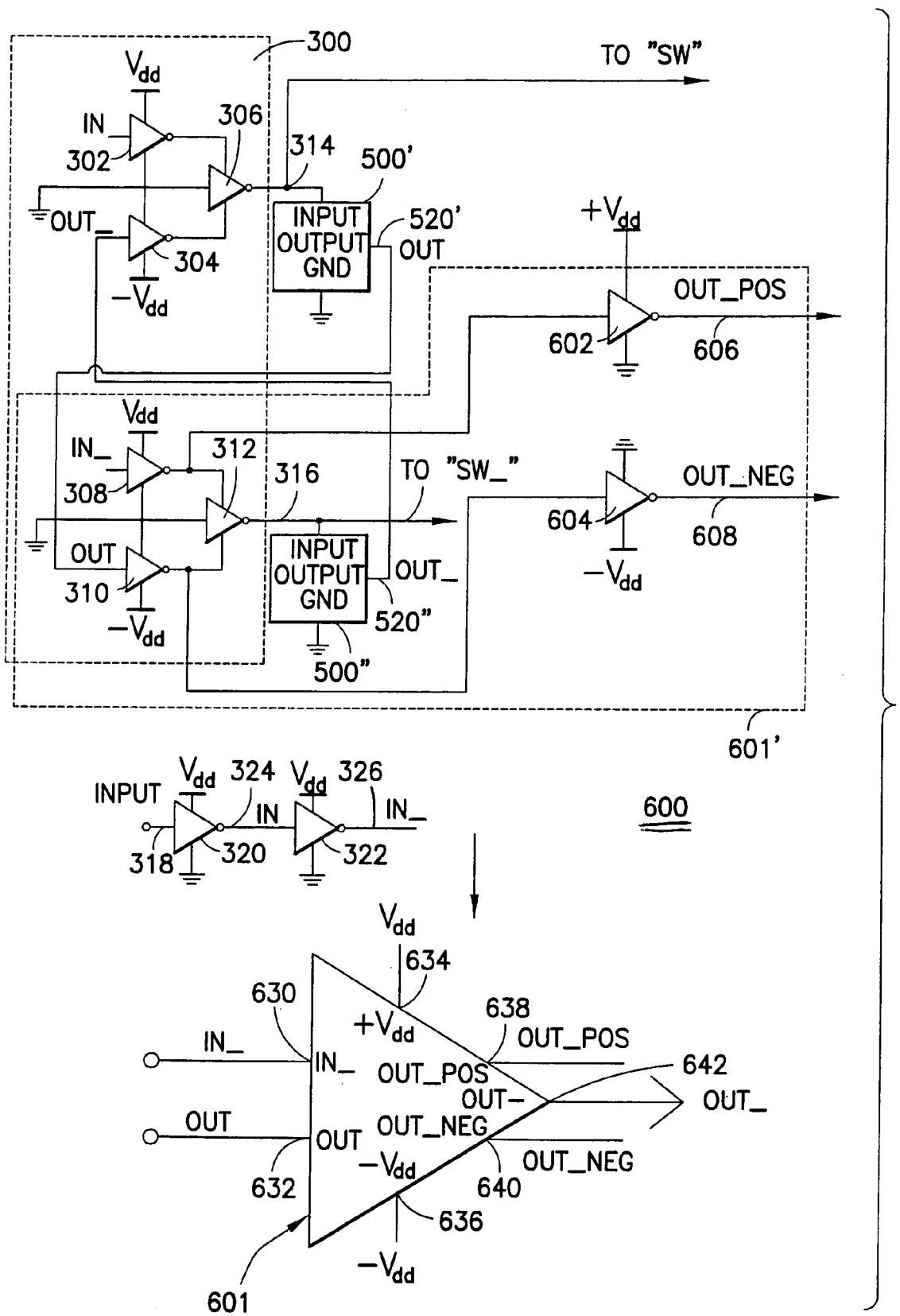

By reducing the voltages that are applied to the gate oxides of the RF switch transistors, the voltage divider 500 of FIGS. 9a and 9b advantageously can be used to increase the reliability of the transistors in both the level shifter 300 and the charge pump circuit described above. For example, FIG. 10 shows a modified level shifter 600 using the voltage divider 500 of FIG. 9a in combination with the level shifter 300 of FIG. 6a. As shown in FIG. 10, the output (at output node 314) of the inverter 306 of the level shifter 300 is applied to an input of a first voltage divider 500'. Similarly, the output (at the output node 316) of the inverter 312 of the level shifter 300 is applied to an input of a second voltage divider 500". The outputs of the voltage dividers are fed back to the input of the feedback inverters 304, 310 as shown in FIG. 10. Specifically, and referring to FIG. 10, the output of the first voltage divider, "out", on the output node 520' is fed back to the input of the feedback inverter 310. Similarly, the output of the second voltage divider, "out_", on the output node 520" is fed back to the input of the feedback inverter 304. As described above with reference to FIG. 9a, the level shifters 500' and 500" reduce the feedback voltages to ranges of −VDD to approximately +0.9 VDC. This reduced voltage swing on the feedback paths does not alter the function of the level shifter 600.

Note that the RF switch control signals, "SW" and "SW_", can be tapped from the level shifter outputs prior to their input to the voltage dividers 500' and 500", and provided as input to the inventive RF switch 30 of FIG. 3. For example, as shown in FIG. 10, the output of inverter 306 at the output node 314 can be tapped and used to generate the switch control signal "SW". Similarly, the output of the inverter 312 at the output node 316 can be tapped and used to generate the switch control signal "SW_". In one embodiment, as described above with reference to the two-stage level shifter and RF buffer circuit 400 of FIG. 8a, the control signals tapped from the nodes 314, 316 are first buffered before being coupled to the RF switch transistors. The switch control signals, SW and SW_, are allowed to have a full-rail voltage swing which does not create gate oxide reliability problems in the RF switch. More specifically, the switch control signals range from −VDD to +Vdd (i.e., the voltage levels of the switch control signals are not limited by the voltage dividers). The full voltage swings of the switch control signals do not raise gate oxide reliability issues with respect to the RF switch MOSFETs because the sources of the RF switch MOSFETs are grounded. The switch input signals are therefore relative to ground in the RF switch MOSFETs. Consequently, the MOSFETs are applied either a positive Vdd voltage relative to ground across the gate oxides, or a negative Vdd voltage relative to ground across the gate oxides.

FIG. 10 also shows a simplified symbolic representation 601 of a section of the modified level shifter 600. The symbol 601 represents the portion indicated by the dashed region 601' of FIG. 10. As shown in FIG. 10, the symbolic modified level shifter 601 includes a first input "in_" 630 corresponding to the input node 326 ("in_"). The symbolic level shifter 601 also includes a second input "out" 632 corresponding to the input to the feedback inverter 310. Note that this signal is also derived from the output 520' of the first voltage divider 500'. A positive power supply voltage is input at a +Vdd input 634. A negative power supply voltage is input at a −VDD input 636. The modified level shifter 601 has three output signals, "out_pos" (at output 638), "out_neg" (at output 640), and "out_" (at output 642). These outputs correspond to the output nodes 606, 608, and 520" described above. For ease of understanding, the symbolic representation of the level shifter 601 is used in the figures described below.

The potential gate oxide reliability problems associated with the level shifter 300 described above with reference to FIG. 6a are averted using the voltage dividers 500' and 500" in the feedback paths of the modified level shifter 600. In addition, the voltage dividers 500' and 500" can also function to reduce potential gate oxide reliability problems associated with the charge pump circuit. As shown in FIG. 10, the outputs of the inverters 308 and 310 are tapped from the level shifter 300 and provided as input to two output inverters to produce two output signals, "out_pos" and "out_neg." More specifically, the output of the inverter 308 is provided as input to a first output inverter 602. Similarly, the output of the feedback inverter 310 is provided as input to a second output inverter 604.

By coupling the output inverters 602, 604 in this manner, the modified level shifter 600 output signals never exceed Vdd (or −VDD). More specifically, the first output inverter 602 generates an output signal, "out_pos", at a first output node 606, that ranges from GND (i.e., 0 VDC) to +Vdd. The second output inverter 604 generates a second output signal, "out_neg", at a second output node 608, that ranges from −VDD to GND. When the input signal "in_" goes to GND, the output signal "out_pos" also goes to GND. The output signal "out_neg" transfers from GND to −VDD. When the input signal "in_" goes positive to +Vdd, "out_pos" also goes to Vdd, and "out_neg" transfers from −VDD to GND. Thus, using the present modified level shifter 600, the "out_pos" output signal ranges from GND to +Vdd, while the "out_neg" output signal ranges from −VDD to GND. As described below in more detail, the two output signals, "out_pos" and "out_neg", are used to address potential gate oxide reliability problems in a modified charge pump circuit. As described now with reference to FIGS. 11a and 11b, these output signals can also be used to address potential gate oxide reliability problems in the RF buffer circuit.

Modified Level Shifter and RF Buffer Circuit

The two-stage level shifter and RF buffer 400 described above with reference to FIG. 8a can experience voltage swings at the RF buffer inverter inputs of approximately 2*Vdd. As already described, this level of voltage swing may present gate oxide reliability problems and detrimentally affect the function of the RF buffer transistors.

Figure 11A:
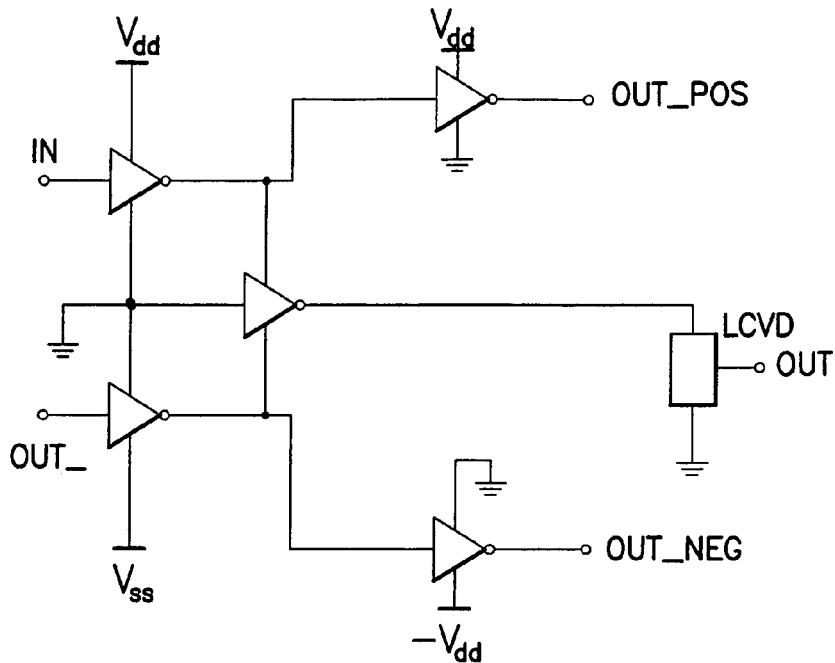
Figure 11B:
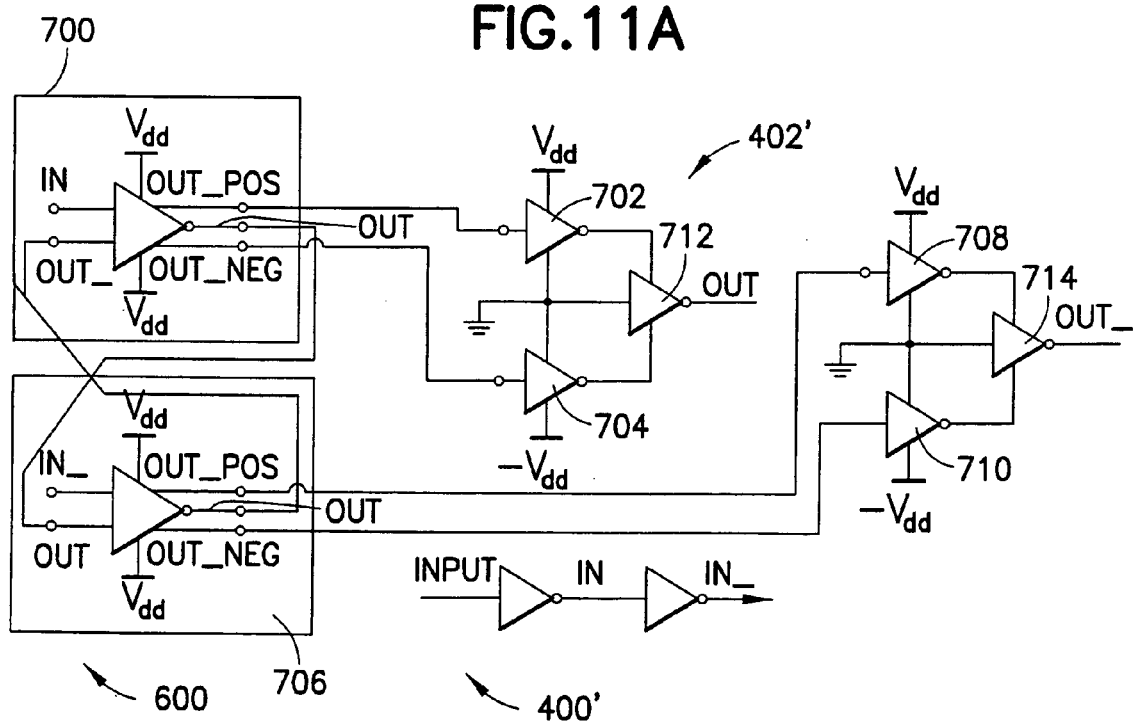

FIGS. 11a and 11b show an alternative embodiment 400' of the two-stage level shifter and RF buffer circuit 400 described above with reference to FIG. 8a. The alternative embodiment of the RF buffer shown in FIG. 11b uses the voltage divider circuit described above to assure that voltages on the gate oxides of the RF buffer never exceed greater than 0.9 volts above Vdd. As shown in FIG. 11b, the alternative two-stage level shifter and RF buffer circuit 400' includes a first stage level shifter circuit 600 coupled to a second stage RF buffer circuit 402'. In this embodiment of the level shifter and RF buffer circuit 400', the modified level shifter outputs, "out_pos" and "out_neg", described above with reference to FIG. 10, are used as input to the RF buffer inverters to generate the RF buffer output signals "out" and "out_". For example, as shown in FIG. 11b, the "out_pos" and "out neg" output signals generated by a first modified level shifter 700 are input to two RF buffer inverters, 702, 704, respectively. Similarly, the "out_pos" and "out_neg" output signals generated by a second modified level shifter 706 are input to two RF buffer inverters, 708, 710, respectively. In accordance with the alternative embodiment 400' shown in FIGS. 11a and 11b, when an input signal "in" is a logical high signal, the "out_pos" output goes to Vdd while the "out_neg" goes to GND. Thus, when the input signal "in" is a logical high value, the output of the inverter 702 goes to GND, and the output of the inverter 704 goes to −Vdd. Therefore, when the input signal "in" is high, the output of the inverter 712 ("out") goes to −VDD. When the input signal "in" is low, the opposite outputs are produced.

The RF buffer inverters 702, 704 are used to control the power supply voltages of a first RF output inverter 712. Similarly, the RF buffer inverters 708, 710 are used to control the power supply voltages of a second RF output inverter 714. In this embodiment, the RF buffer output signals, "out" and "out_", are used to control the RF switch (i.e., output signal "out" acts as control voltage "SW", while "out_" acts as control voltage "SW_").

Modified Charge Pump—An Alternative Embodiment

As noted above, the two output signals "out_pos" and "out_neg" generated by the modified level shifter 600 of FIG. 10 can be used in an alternative embodiment of the charge pump circuit to reduce or eliminate potential gate oxide reliability problems associated with excessive voltages applied to the charge pump. As described above with reference to FIGS. 5b and 5c, the clock signals used to control the gates of the charge pump transistors (i.e., the P-channel transistors 208, 210, and the N-channel transistors 212, 214) have voltage swings of 2 *Vdd. For example, as shown in FIG. 5c, the charge pump clock signals, "Clk1" and "Clk2", range from the negative power supply voltage −VDD to the positive power supply voltage +Vdd. Similar to the gate oxide reliability issues described above with reference to the RF buffer and level shifter circuits, this full-rail voltage swing may present oxide reliability problems in the charge pump circuit. Therefore, a modified charge pump circuit is shown in FIG. 12 which reduces or eliminates potential gate oxide reliability problems by limiting the voltages applied to gate oxides to range from −VDD to 0.9 volts.

Figure 12:
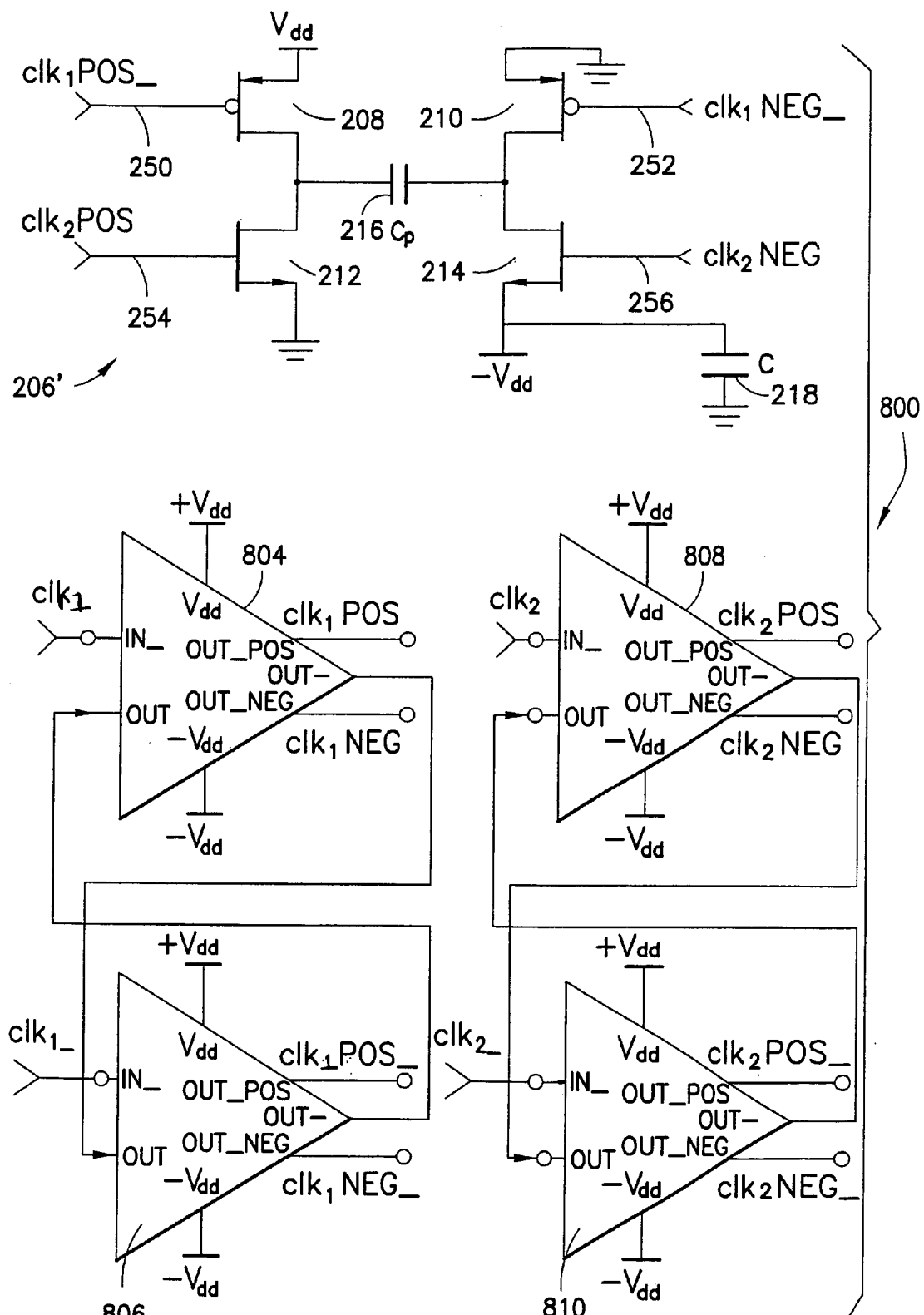
FIG. 12 is an electrical schematic of a modified charge pump using the level shifting circuit of FIG. 10.

FIG. 12 shows a modified charge pump 800 that uses the modified level shifter 600 described above with reference to FIG. 10. As shown in FIG. 12, the modified charge pump 800 comprises a charge pump circuit 206' and an inventive charge pump clock generation circuit 802. The charge pump clock generation circuit 802 generates the clock control signals used by the charge pump circuit 206'. The charge pump circuit 206' is very similar in design to the charge pump 206 described above with reference to FIG. 5b. For example, the charge pump 206' includes a pair of P-channel transistors 208, 210, and a pair of N-channel transistors 212, 214, in addition to a pass capacitor Cp 216 and an output capacitor C 218. In one embodiment of the charge pump circuit 206', the output capacitor C 218 has a capacitance on the order of a few hundred pF, and the capacitor Cp 216 has a capacitance of approximately 50 pF. Those skilled in the charge pump design arts shall recognize that other capacitance values can be used without departing from the scope or spirit of the present invention.

The charge pump 206' functions very similarly to the charge pump 206 described above with reference to FIG. 5a, and therefore its operation is not described in detail again here. The charge pump 206' shown in FIG. 12 differs from the charge pump 206 in that the control signals used to control the charge pump 206' transistor gates (i.e., the gates of the transistors 208, 210, 212, and 214) are limited to half-rail voltage swings (i.e., they are limited to range from −VDD to ground, or from ground to Vdd). Potential gate oxide reliability problems invoked when the gate control voltages are allowed to swing a full rail (i.e., from −VDD to Vdd) are thereby reduced or eliminated.

As shown in FIG. 12, the charge pump clock generation circuit 802 includes four modified level shifters 804, 806, 808 and 810, coupled together in a feedback configuration.

In one embodiment of the modified charge pump, the four modified level shifters are implemented by the modified level shifter 600 described above with reference to FIG. 10. FIG. 12 shows the level shifters using the symbolic representation 601 of the level shifter 600 of FIG. 10. In this embodiment, the level shifters 804, 806, 808, and 810 perform identically to the level shifter 600 of FIG. 10. The two non-overlapping clock signals, "Clk1", and "Clk2" (and their inverse signals, "Clk1_" and "Clk2_", respectively) are input to the "in_" inputs of the level shifters as shown in FIG. 12. The two input clock signals, "Clk1" and "Clk2", are identical to the non-overlapping clock signals described above with reference to FIGS. 5a–5c. As shown above with reference to FIG. 5c, the two non-overlapping clock signals vary in voltage amplitude from −VDD to +Vdd. In one embodiment, the clock signals vary from −3 VDC to +3 VDC.

The four modified level shifters generate the half-rail clock control signals that are used to control the charge pump 206'. Specifically, as shown in FIG. 12, the four level shifters generate the "CLK1POS_", "CLK1NEG_", "CLK2POS", and "CLK2NEG" control signals that are input to the charge pump transistor gate control nodes 250, 252, 254 and 256, respectively. In the embodiment shown in FIG. 12, the level shifters 806 and 808 generate the four transistor gate control signals "CLK1POS_", "CLK1NEG_", "CLK2POS", and "CLK2NEG". The level shifter 806 generates the "CLK1POS_" and "CLK1NEG_" gate control signals, while the level shifter 808 generates the "CLK2POS", and "CLK2NEG" gate control signals. More specifically, as shown in FIG. 12, the "out_pos" output of the level shifter 806 ("CLK1POS_") is coupled to control the transistor gate input 250 of the transistor 208. The "out_neg" output of the level shifter 806 ("CLK1NEG_") is coupled to control the transistor gate input 252 of the transistor 210. Similarly, the "out_pos" output of the level shifter 808 ("CLK2POS") is coupled to control the transistor gate input 254 of the transistor 214. Finally, the "out_neg" output of the level shifter 808 ("CLK2NEG") is coupled to control the transistor gate input 256 of the transistor 214. The clock generation circuit 802 functions to prevent excessive voltages across the gate oxides of the charge pump transistors.

Those skilled in the transistor design arts shall recognize that other control configurations can be used without departing from the spirit or scope of the present invention. For example, the other two level shifters (804, 810) can be used to generate the control signals in an alternative embodiment of the modified charge pump. Also, as described above with reference to the charge pump circuit 206, alternative transistor configurations (N-channel and P-channel) can be used to implement the modified charge pump 206' of the present invention.

As shown in FIG. 12, the four level shifters 804, 806, 808 and 810 are coupled together in level shifter pairs (804 with 806, and 808 with 810) in a feedback configuration that is very similar to the feedback topology of the level shifter described above with reference to FIG. 6a. For example, the "out_" output node of the level shifter 804 is provided as feedback to the "out" node of its associated pair level shifter 806. Similarly, the "out_" output node of the level shifter 806 is provided as feedback to the "out" node of its associated pair level shifter 804. Similarly, the "out_" output node of the level shifter 808 is provided as feedback to the "out" node of its associated pair level shifter 810. The "out_" output node of the level shifter 810 is provided as feedback to the "out" node of its associated pair level shifter 808. The feedback configuration is used by the clock generation circuit 802 in the generation of the four transistor gate control signals "CLK1POS_", "CLK1NEG_", "CLK2POS", and "CLK2NEG".

Summary

A novel RF switch is provided wherein the switch is fabricated using an SOI CMOS process. Fabricating the switch on an SOI substrate results in lack of substrate bias and allows the integration of key CMOS circuit building blocks with the RF switch elements. Integration of the CMOS building blocks with RF switch elements provides a fully integrated RF switch solution that requires use of only a single external power supply (i.e., the negative power supply voltage is generated internally by a charge pump circuit integrated with the RF switch). This results in improvements in RF switch isolation, insertion loss and compression. In one embodiment, the RF switch has a 1 dB compression point exceeding approximately 1 Watt, an insertion loss of less than approximately 0.5 dB, and switch isolation as high as approximately 40 dB. The inventive switch also provides improvements in switching times.

A number of embodiments of the present invention have been described. Nevertheless, it will be understood that various modifications may be made without departing from the spirit and scope of the invention.

Accordingly, it is to be understood that the invention is not to be limited by the specific illustrated embodiments, but only by the scope of the appended claims.

What is claimed is:

1. An RF switch circuit for switching RF signals, comprising:
    (a) a first input port receiving a first RF input signal;
    (b) a second input port receiving a second RF input signal;
    (c) an RF common port;
    (d) a first switch transistor grouping comprising a plurality of FETs arranged in a stacked configuration, wherein each of said FETs has a gate that is insulated from its channel, wherein said first switch transistor grouping has a first node coupled to the first input port and a second node coupled to the RF common port, and wherein the first switch transistor grouping is controlled by a switch control signal (SW);
    (e) a second switch transistor grouping comprising a plurality of FETs arranged in a stacked configuration, wherein each of said FETs has a gate that is insulated from its channel, wherein said second transistor grouping has a first node coupled to the second input port and a second node coupled to the RF common port, and wherein the second switch transistor grouping is controlled by an inverse (SW_) of the switch control signal (SW);
    (f) a first shunt transistor grouping comprising a plurality of FETs arranged in a stacked configuration, wherein each of said FETs has a gate that is insulated from its channel, wherein said first shunt transistor grouping has a first node coupled to the second input port and a second node coupled to ground, and wherein the first shunt transistor grouping is controlled by the switch control signal (SW); and
    (g) a second shunt transistor grouping comprising a plurality of FETs arranged in a stacked configuration, wherein each of said FETs has a gate that is insulated from its channel, wherein said second shunt transistor grouping has a first node coupled to the first input port and a second node coupled to ground, wherein the second shunt transistor grouping is controlled by the inverse (SW_) of the switch control signal (SW); wherein, when SW is enabled, the first switch and shunt transistor groupings are enabled while the second switch and shunt transistor groupings are disabled, thereby passing the first RF input signal through to the RF common port and shunting the second RF input signal to ground; and wherein when SW is disabled, the second switch and shunt transistor groupings are enabled while the first switch and shunt transistor groupings are disabled, thereby passing the second RF input signal through to the RF common port and shunting the first RF input signal to ground.

2. The RF switch circuit of claim 1, wherein the switch circuit is fabricated in a silicon-on-insulator (S0I) technology.

3. The RF switch circuit of claim 1, wherein the switch circuit is fabricated on an Ultra-Thin-Silicon ("UTSi") substrate.

4. The RF switch circuit of claim 3, wherein the FETs are MOSFET transistors formed in a thin silicon layer on a fully insulating sapphire wafer.

5. The RF switch circuit of claim 1, intended for switching RF signals having an operating period 1/Fo, wherein the gate of each FET has a capacitance Cg to its channel, and the gate is coupled to a control voltage via a gate resistor Rg having a value such that Rg*Cg>1/Fo.

6. The RF switch circuit of claim 1, wherein the gate of each FET is coupled to a control voltage via a gate resistor Rg having a value of at least about 30 kΩ.

7. The RF switch circuit of claim 2, wherein the circuit is designed for switching RF signals at an operating frequency Fo, the FETs are MOSFETs, the gate of each FET has a capacitance Cg to its channel, and the gate is coupled to a control voltage via a gate resistor Rg having a value such that Rg*Cg>1/Fo.

8. The RF switch circuit of claim 7, wherein the stacked MOSFETs of each grouping of transistors share the signal voltage substantially equally without a need for ballast resistors parallel to a conduction path of such stacked MOSFETs, and wherein all Rg of the MOSFETs of each particular grouping are commonly controlled by a corresponding switching voltage.

9. The RF switch circuit of claim 8, wherein the gate resistors coupled to the transistor gate nodes of the second switch and shunt transistor groupings are commonly coupled to the inverse switch control signal SW_.

10. The RF switch circuit of claim 1, wherein the FETs are MOSFETs having associated gate capacitance and an associated gate resistor coupling the gate to a drive signal, wherein RC time constants associated with each MOSFET within the transistor groupings are functions of the associated gate resistors and the associated gate capacitances, and wherein the RC time constant of each transistor far exceeds a period of the RF input signals thereby causing RF voltages to be shared equally across the MOSFETs.

11. The RF switch circuit of claim 1, wherein a breakdown voltage across the plurality of stacked MOSFET transistors of a selected transistor grouping is n times a breakdown voltage of an individual MOSFET transistor in the selected transistor grouping, wherein n comprises the total number of MOSFET transistors in the selected transistor grouping.

12. The RF switch circuit of claim 1, wherein RF signals provided to the input ports may swing about a zero reference voltage.

13. The RF switch circuit of claim 7, wherein the first and second RF input signals have associated input power levels, and wherein increased input power levels can be accommodated by the RF switch circuit by increasing the number of MOSFET transistors per transistor grouping.

14. The RF switch circuit of claim 7, wherein the first and second RF input signals have associated input power levels, and wherein increased input power levels can be accommodated by the RF switch circuit by varying the physical size of the transistors used in implementing the transistor groupings.

15. A fully integrated RF switch circuit, comprising:
   (a) the RF switch circuit as set forth in claim 1;
   (b) a control logic block, coupled to the RF switch circuit, wherein the control logic block outputs the switch control signal (SW) and the inverse switch control signal (SW_); and
   (c) a negative voltage generator, coupled to the control logic block, wherein the negative voltage generator receives a positive power supply voltage from an external power supply, and wherein the negative voltage generator outputs a negative power supply voltage.

16. A method of switching RF signals, comprising:
   (a) inputting a first RF input signal to a first switch transistor grouping and a first shunt transistor grouping, wherein both the first switch and first shunt transistor groupings comprise a plurality of stacked FETs, each of which has a gate that is insulated from its channel;
   (b) inputting a second RF input signal to a second switch transistor grouping and a second shunt transistor grouping, wherein both the second switch and second shunt transistor groupings comprise a plurality of stacked FETs, each of which has a gate that is insulated from its channel;
   (c) enabling the first switch transistor grouping while disabling the first shunt transistor grouping, and simultaneously disabling the second switch transistor grouping while enabling the second shunt transistor grouping, thereby passing the first RF input signal and shunting the second RF input signal; and, at exclusively alternative times,
   (d) enabling the second switch transistor grouping while disabling the second shunt transistor grouping, and simultaneously disabling the first switch transistor grouping while enabling the first shunt transistor grouping, thereby passing the second RF input signal and shunting the first RF input signal.

17. The method of claim 16, wherein the RF signals are expected to have a minimum operating frequency Fo, and wherein each FET has a gate capacitance Cg between its gate and its channel, and is coupled to a drive signal via an associated gate resistor Rg, the method further comprising ensuring that a product of Rg times Cg is greater than 1/Fo.

18. The method of claim 17, wherein the FETs are MOSFETs, and the method further comprises fabricating the switch circuit on a fully insulating sapphire wafer.

19. The method of claim 18, wherein the method further comprises fabricating the switch circuit on an Ultra-Thin-Silicon ("UTSi") substrate.

20. The method of claim 16, wherein each FET is coupled to a drive signal via an associated gate resistor Rg having a value of at least about 30 kΩ.

* * * * *

UNITED STATES PATENT AND TRADEMARK OFFICE
CERTIFICATE OF CORRECTION

PATENT NO.         : 7,123,898 B2
APPLICATION NO.    : 10/922135
DATED              : October 17, 2006
INVENTOR(S)        : Burgener et al.

Page 1 of 1

It is certified that error appears in the above-identified patent and that said Letters Patent is hereby corrected as shown below:

Column 1, line 10, "Patent No. 6,805,502" should read --Patent No. 6,804,502--.

Signed and Sealed this

Twelfth Day of August, 2008

JON W. DUDAS
*Director of the United States Patent and Trademark Office*